(12) United States Patent
Wu et al.

(10) Patent No.: US 11,444,126 B2
(45) Date of Patent: Sep. 13, 2022

(54) MEMORY DEVICE AND MANUFACTURING METHOD THEREOF

(71) Applicant: Taiwan Semiconductor Manufacturing Company, Ltd., Hsinchu (TW)

(72) Inventors: Chao-I Wu, Hsinchu County (TW); Yu-Ming Lin, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 67 days.

(21) Appl. No.: 17/165,884

(22) Filed: Feb. 2, 2021

(65) Prior Publication Data

US 2022/0028930 A1  Jan. 27, 2022

Related U.S. Application Data

(60) Provisional application No. 63/055,908, filed on Jul. 24, 2020.

(51) Int. Cl.
*H01L 27/24* (2006.01)
*H01L 45/00* (2006.01)

(52) U.S. Cl.
CPC ...... *H01L 27/2481* (2013.01); *H01L 27/2436* (2013.01); *H01L 45/06* (2013.01); *H01L 45/1233* (2013.01); *H01L 45/1253* (2013.01); *H01L 45/14* (2013.01)

(58) Field of Classification Search
CPC .................................................. H01L 27/2481
See application file for complete search history.

(56) References Cited

U.S. PATENT DOCUMENTS

| 9,196,657 | B2* | 11/2015 | Cho | H01L 45/1253 |
| 11,018,189 | B2* | 5/2021 | Nonoguchi | H01L 23/528 |
| 2019/0067374 | A1* | 2/2019 | Franca-Neto | G11C 13/0007 |
| 2019/0088870 | A1* | 3/2019 | Yamaguchi | G11C 11/221 |
| 2021/0375928 | A1* | 12/2021 | Wu | H01L 29/66969 |

\* cited by examiner

*Primary Examiner* — Mounir S Amer
(74) *Attorney, Agent, or Firm* — JCIPRNET

(57) ABSTRACT

A memory device and a manufacturing method thereof are provided. The memory device includes word lines, channel layer, gate dielectric layers, a conductive pillar and a storage pillar. The word lines extend along a first direction over a substrate, and are vertically spaced apart from one another. The channel layers respectively line along a sidewall of one of the word lines. The gate dielectric layers respectively line between one of the word lines and one of the channel layers. The conductive pillar and the storage pillar penetrate through the channel layers. The storage pillar includes an inner electrode, a switching layer and an outer electrode. The switching layer wraps around the inner electrode. The outer electrode laterally surrounds the switching layer, and includes annulus portions vertically spaced apart from one another and each in lateral contact with a corresponding one of the channel layers.

20 Claims, 39 Drawing Sheets

MEMORY DEVICE AND MANUFACTURING METHOD THEREOF

This application claims the priority benefit of U.S. provisional applications Ser. No. 63/055,908, filed on Jul. 24, 2020. The entirety of the above-mentioned patent application is hereby incorporated by reference herein and made a part of this specification.

BACKGROUND

In the past decades, growing demand for data storage has led to continuously scaling of non-volatile memory, and to development of cells in the non-volatile memory from single-level cells (SLCs) to multi-level cells (MLCs). However, these solutions are limited by the confines of two-dimensional design. All of the cells in the non-volatile memory are lined up next to each other in a string, but there is only one level of cells. This ultimately limits the capacity that the non-volatile memory could offer.

Three-dimensional memory is a new evolution that solves some of the problems with storage capacity of the non-volatile memory. By stacking cells vertically, it is possible to dramatically increase the storage capacity without significantly increasing footprint area of the non-volatile memory. Comprehensive studies on three-dimensional flash memories have been conducted. On the other hand, three-dimensional one-transistor-one-resistor (1T1R)/one-transistor-one-capacitor (1T1C) memories are limited to usage of two-terminal selectors, rather than three-terminal transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
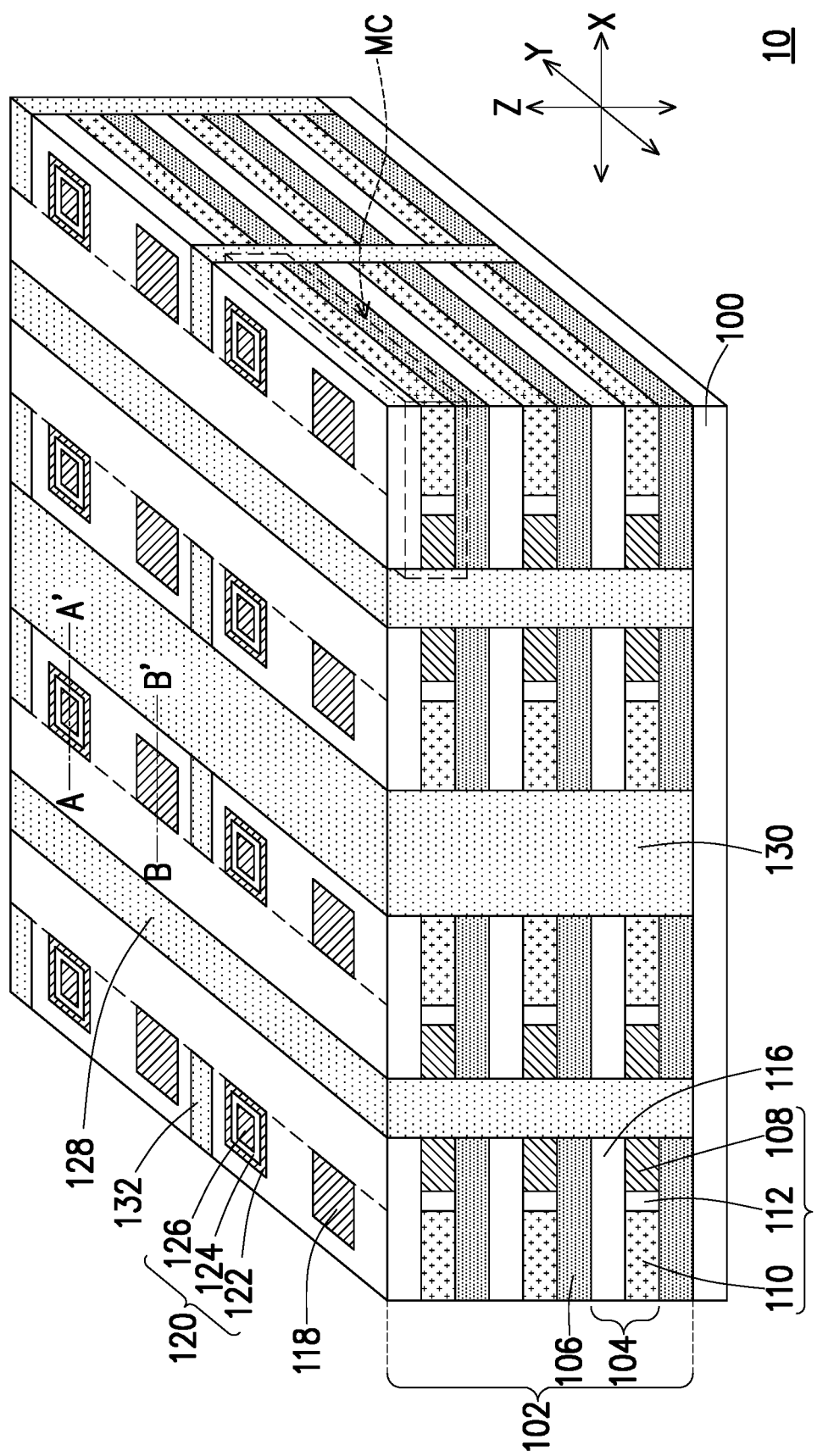
FIG. 1A is a schematic three-dimensional view illustrating a memory device according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
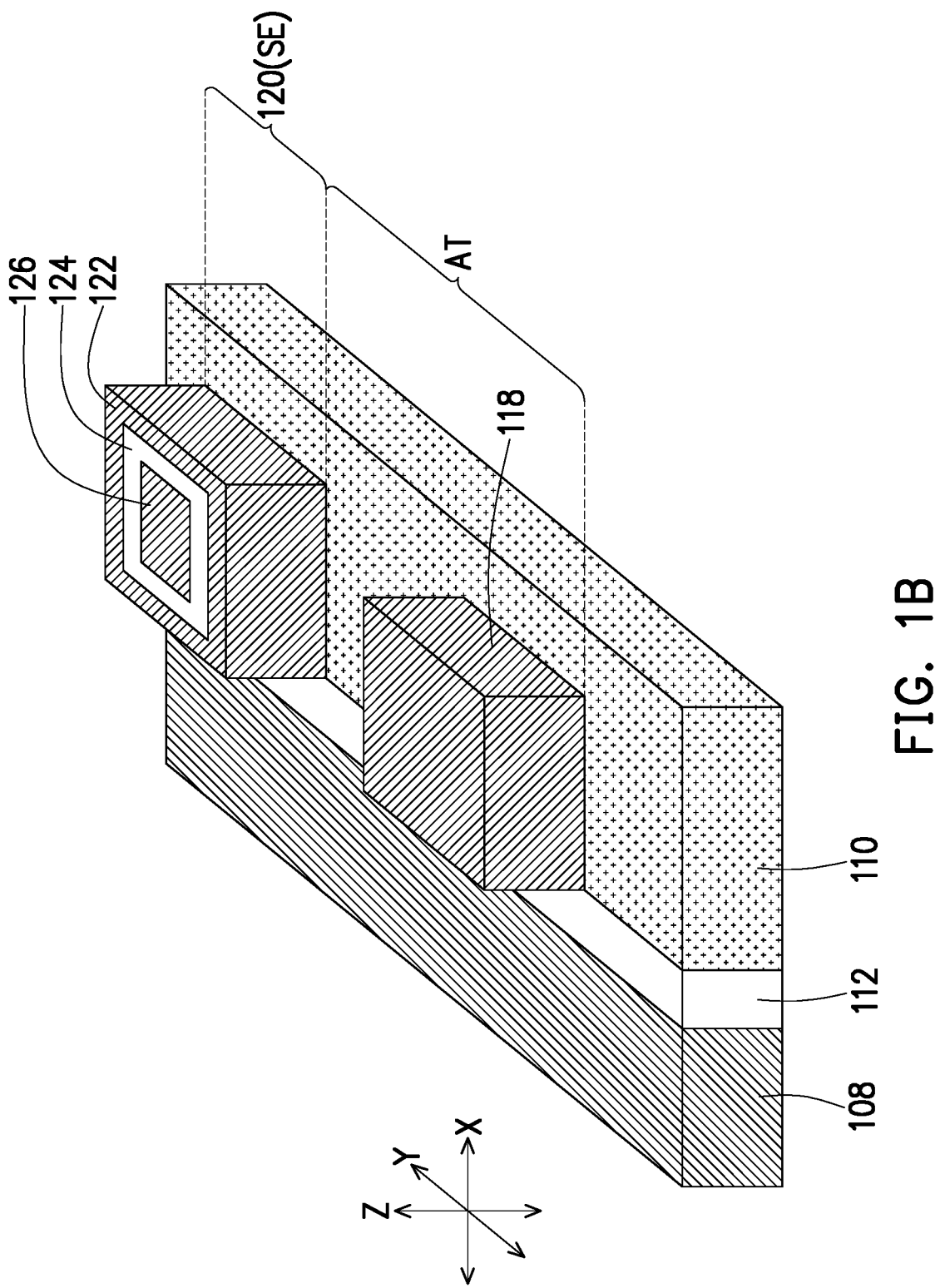
FIG. 1B is a schematic three-dimensional view illustrating a memory cell in the memory device as shown in FIG. 1A.

FIG. 1A is a schematic three-dimensional view illustrating a memory device 10 according to some embodiments of the present disclosure. FIG. 1B is a schematic three-dimensional view illustrating a memory cell MC in the memory device 10 as shown in FIG. 1A.

Referring to FIG. 1A and FIG. 1B, the memory device 10 is a three-dimensional memory device, and includes stacks of memory cells MC formed on a substrate 100. In some embodiments, the substrate 100 is an etching stop layer over a semiconductor substrate (not shown), such as a semiconductor wafer or a semiconductor-on-insulator (SOI) wafer. In these embodiments, active devices (e.g., transistors) and interconnections of these active devices (both not shown) may be formed between the substrate 100 and the semiconductor wafer (or the SOI wafer). In alternative embodiments, the substrate 100 is the semiconductor wafer or the SOI wafer.

The memory cells MC are formed in pairs of stacking structures 102. Each of the stacking structures 102 may extend along a direction Y. The stacking structures 102 of each pair may be laterally spaced apart from each other along a direction X intersected with the direction Y. Further, adjacent pairs of the stacking structures 102 may be laterally spaced apart from each other along the direction X as well. Each of the stacking structures 102 includes multiple film sets 104 stacked along a vertical direction Z. Further, each of the stacking structures 102 includes spacer layers 106. The film sets 104 in each stacking structure 102 are vertically separated from one another by the spacer layers 106. In some embodiments, the bottommost film set 104 in each stacking structure 102 is separated from the substrate 100 by a bottommost one of the spacer layers 106. Each film set 104 includes a word line 108, a channel layer 110 laterally adjacent to the word line 108, and a gate dielectric layer 112 lining between the word line 108 and the channel layer 110. The word line 108, the channel layer 110 and the gate dielectric layer 112 may have substantially identical thickness, and can be collectively regarded as a composite layer 114. The composite layer 114 extends along the direction Y. A sidewall of the word line 108 and a sidewall of the channel layer 110 define opposite sidewalls of the composite layer 114. In some embodiments, sidewalls of the composite layers 114 are substantially coplanar with sidewalls of the isolation layers 116 and the spacer layers 106. Moreover, in some embodiments, the composite layers 114 in a stacking structure 102 are in mirror symmetry with the composite layers 114 in another stacking structures 102 in the same pair, with respect to a central axis between these stacking structures 102 and extending along the direction Y. Accordingly, the word lines 106 in these stacking structures 102 are located between the gate dielectric layers 112 in these stacking structures 102, and the gate dielectric layers 112 in these stacking structures 102 are located between the channel layers 110 in these stacking structures 102. Furthermore, each film set 104 also includes an isolation layer 116 separating the composite layer 114 from the vertically adjacent spacer layer 106. The isolation layer 116 may also extend along the direction Y. In some embodiments, the isolation layer 116 lies above the composite layer 114 in the same film set 104. In alternative embodiments, the isolation layers 116 lies below the composite layer 114 in the same film set 104. The word lines 108 are formed of a conductive material; the channel layers 110 are formed of a semiconductor material; the gate dielectric layers 112 are formed of a dielectric material; and the isolation layers 116 are formed of an insulating material. For instance, the conductive material may include tungsten, titanium nitride, ruthenium, tantalum nitride, molybdenum, tungsten nitride, the like or combinations thereof; the semiconductor material may include a metal oxide material (e.g., indium gallium zinc oxide (IGZO), other indium-based oxide material or the like); the dielectric material may include silicon oxide or a high-k dielectric material (i.e., a dielectric material having dielectric constant (k) greater than 3.9, or greater than 7 or more, such as hafnium oxide, hafnium aluminum oxide, hafnium silicate, tantalum oxide, aluminum oxide, zirconium oxide, the like or combinations thereof); and the insulating material may include silicon oxide, silicon nitride, silicon oxynitride, the like or combinations thereof. Moreover, as will be also described with reference to FIG. 3F and FIG. 3I, FIG. 4A and FIG. 4D, the spacer layer 106 may be formed of a functional material that can be selectively deposited by an insulating material, while preventing from being deposited by a conductive material. Alternatives of such functional material may include a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof. Optionally, a surface treatment can be performed on the functional material for ensuring the as-described selectivity.

Conductive pillars 118 and storage pillars 120 are formed in the stacking structures 102. The conductive pillars 118 and the storage pillars 120 in each of the stacking structures 102 are alternately arranged along the extending direction of the stacking structures 102 (e.g., the direction Y), and are laterally spaced apart from one another. In other words, multiple pairs of the conductive pillars 118 and the storage pillars 120 are formed in each of the stacking structures 102. The conductive pillar 118 and the storage pillar 120 of each pair are spaced apart from each other, and adjacent pairs of the conductive pillars 118 and the storage pillars 120 are laterally spaced apart from each other as well. The conductive pillars 118 and the storage pillars 120 vertically extend through the stacking structures 102, and may stand on the substrate 100. Accordingly, each of the conductive pillars 118 and the storage pillars 120 is laterally surrounded by one of the stacking structures 102. In some embodiments, each of the conductive pillars 118 and the storage pillars 120 is completely surrounded by one of the stacking structures 102, and may not laterally protrude from sidewalls of the stacking structures 102. The spacer layers 106, the channel layers 110 and the isolation layers 116 in the stacking structures 102 are penetrated through by the conductive pillars 118 and the storage pillars 120, whereas the word lines 108 and the gate dielectric layers 112 in the stacking structures 102 may not be penetrated through by the conductive pillars 118 and the storage pillars 120. In some embodiments, as shown in FIG. 1A and FIG. 1B, the conductive pillars 118 and the storage pillars 120 are located aside the word lines 108 and the gate dielectric layers 112, and are in lateral contact with the gate dielectric layers 112. Further, although the conductive pillars 118 and the storage pillars 120 are depicted as rectangular pillars, the conductive pillars 118 and the storage pillars 120 may alternatively be formed as other shapes (e.g., circular pillars), the present disclosure is not limited thereto.

The storage pillars 120 respectively include an outer electrode 122, a switching layer 124 and an inner electrode 126. The outer electrode 122 laterally surrounds the inner electrode 126, and the switching layer 124 spans between the outer electrode 122 and the inner electrode 126. In this way, the outer electrodes 122 are in lateral contact with the stacking structures 102, whereas the inner electrodes 126 are spaced apart from the stacking structures 102 by the switching layers 124 and the outer electrodes 122. The storage pillar 120 is functioned for data storage. In some embodiments, the switching layer 124 is formed of a resistance variable material, and the storage pillars 120 can be regarded as a variable resistor. In these embodiments, application of voltage bias set between the outer electrode 122 and the inner electrode 126 may enable a transition of the switching layer 124 from a high resistance state (or logic "0") to a low resistance state (or logic "1"), and vice versa. As the switching layer 124 being switched from a high resistance state to a low resistance state, a conductive path (e.g., a conductive filament) may be formed in the switching layer 124, and result in soft breakdown of the switching layer 124. On the other hand, by applying a voltage bias of opposite polarity on the outer electrode 122 and the inner electrode 126, the conductive path may be cut off, and the switching layer 124 is switched from a low resistance state to a high resistance state. The resistance variable material may include, for example, hafnium oxide, zirconium oxide, hafnium zirconium oxide (HfZrO), hafnium aluminum oxide (HfAlO), hafnium oxynitride (HfON), hafnium strontium oxide (HfSrO), hafnium yttrium oxide (HfYO), the like or combinations thereof.

In other embodiments, the switching layer 124 is formed of a phase change material, and the storage pillar 120 may also be regarded as a variable resistor. In these embodiments, crystallinity of the switching layer 124 can be locally altered, and such variation of crystallinity enables a transition of the switching layer 124 from a high resistance state (or logic "0") to a low resistance state (or logic "1"), and vice versa. This change of crystallinity of the switching layer 124 may be carried out by joule heating generated by one of the outer electrode 122 and the inner electrode 126. For instance, the inner electrode 126 may be configured to receive voltage pulses, and to generate joule heat for carrying out the transition of the switching layer 124. The phase change material may be, for example, a chalcogenide material, and include one or more of Ge, Te and Sb. For instance, the chalcogenide material may be GeSbTe, such as $Ge_2Sb_2Te_5$ (GST225), $Ge_4Sb_2Te_4$ (GST424) or so forth). In certain cases, the chalcogenide material may be doped with N, Si, C, In, Ga or the like, and an example of such chalcogenide material may be doped $Ge_6Sb_1Te_2$ (GST612).

In yet other embodiments, the switching layer 124 is formed of a ferroelectric material, and the storage capacitor 120 may be regarded as a capacitor with variable capacitance. In order to store charges in the storage capacitor 120, the access transistor AT (as will be further described) is turned on, and a high voltage is applied to the inner electrode 126. Due to dipole moment stored in the switching layer 124, charges are induced, and capacitance of the storage capacitor 120 is altered. On the other hand, in order to discharge the storage capacitor 120, the access transistor AT is turned on, and the inner electrode 126 is grounded or coupled to a reference voltage. Switch of the capacitance may indicate a logic high state or a logic low state of the capacitor. For instance, the ferroelectric material may include a hafnium-oxide-based material (e.g., hafnium zirconium oxide ($Hf_{1-x}Zr_xO$), hafnium erbium oxide ($Hf_{1-x}Er_xO$), hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium titanium oxide ($Hf_{1-x}Ti_xP$), hafnium tantalum oxide ($Hf_{1-x}Ta_xO$) or the like), barium titanate (e.g., $BaTiO_3$), lead titanate (e.g., $PbTiO_3$), lead zirconate (e.g., $PbZrO_3$), lithium niobate ($LiNbO_3$), sodium niobate ($NaNbO_3$), potassium niobate (e.g., $KNbO_3$), potassium tantalate ($KTaO_3$), bismuth scandate ($BiScO_3$), bismuth ferrite (e.g., $BiFeO_3$), aluminum scandium nitride (AlScN), the like or combinations thereof.

On the other hand, in those embodiments where the switching layer 124 is formed of the resistance variable material, the outer electrode 122 and the inner electrode 124 may respectively be formed of a conductive material, such as titanium nitride, tantalum nitride, tungsten, titanium, tantalum, aluminum, copper, aluminum-copper alloy (AlCu), the like or combinations thereof. In those embodiments where the switching layer 124 is formed of the phase change material, one of the outer electrode 122 and the inner electrode 124 that is functioned as a heater may be formed of a high resistance conductive material, while the other one of the outer electrode 122 and the inner electrode 124 may be formed of the afore-mentioned conductive material. For instance, the high resistance conductive material may include titanium nitride, tantalum nitride, the like or combinations thereof. In addition, in those embodiments, where the switching layer 124 is formed of the ferroelectric material, the outer electrode 122 and the inner electrode 124 may respectively formed of the afore-mentioned conductive material. Further, the conductive pillars 118 may also be formed by the afore-mentioned conductive material.

Referring to FIG. 1A and FIG. 1B, a section of one of the word lines 108, a section of the gate dielectric layers 112 in lateral contact with the section of the word line 108, a section of the channel layer 110 in lateral contact with the section of the gate dielectric layer 112, and the conductive pillar 118 and the storage pillar 120 penetrating through the section of the channel layer 110 collectively form one of the memory cells MC. The memory cell MC may include an access transistor AT and a storage element SE connected to the access transistor AT. The section of the word line 108 may be functioned as a gate terminal of the access transistor AT. In addition, the conductive pillar 118 may be functioned as one of source and drain terminals of the access transistor AT, and the outer electrode 122 of the storage pillar 120 may be functioned as the other one of the source and drain terminals of the access transistor AT. In other words, the access transistor AT is a three-terminal transistor. When the access transistor AT is turned on, a conductive channel may be formed in a portion of the channel layer 110 between the conductive pillar 118 and the storage pillar 120. In addition, the conductive channel may be cut off or absent when the access transistor AT is in an off state. On the other hand, the storage pillar 120 may be functioned as the storage element SE. The outer electrode 122 of the storage pillar 120 may be shared by the access transistor AT and the storage element SE, and functioned as a common node of the access transistor AT and the storage element SE. When the access transistor AT is turned on, the voltage bias across the switching layer 124 can be determined by the voltage received by the conductive pillar 118 and the voltage received by the inner electrode 126 of the storage node, and the storage element SE can be subjected to a write operation or a read operation. On the other hand, when the access transistor AT is in an off state, the common node would be electrically floated, and the storage element SE becomes inaccessible. In those embodiments where the storage pillar 120 is a variable resistor, the memory cell MC may be regarded as a 1T1R memory cell. In other embodiments where the storage pillar 120 is a variable capacitor, the memory cell MC may be regarded as a 1T1C memory cell. As shown in FIG. 1A, a stack of the memory cells MC may share the same pair of the conductive pillar 118 and the storage pillar 120, while being controlled by different word lines 108. In addition, a column of the memory cells MC at the same height may share the same word line 108, the same gate dielectric layer 112 and the same channel layer 110, while being controlled by different pairs of the conductive pillars 118 and the storage pillars 120.

In some embodiments, the stacking structures 102 of each pair are laterally separated from each other by an isolation wall 128. In addition, adjacent pairs of the stacking structures 102 may be laterally separated from each other by an isolation wall 130. In some embodiments, the isolation wall 130 may have a width (i.e., a dimension along the direction X) greater than a width of the isolation wall 128. In alternative embodiments, the width of the isolation wall 130 may be identical with or less than the width of the isolation wall 128. Moreover, in some embodiments, the memory device 10 further includes isolation pillars 132. The isolation pillars 132 vertically penetrate through the stacking structures 102, and separate each channel layer 110 in the stacking structures 102 into separated sections. The separated sections of each channel layer 110 are respectively penetrated through by a pair of the conductive pillars 118 and the storage pillar 120. Accordingly, each section of the channel layers 110 can be exclusively included in one of the memory cells MC, and sections of the channel layers 110 in a column of the memory cells MC at the same height can be separated by a column of the isolation pillars 132 arranged along the direction Y. In some embodiments, the isolation pillars 132 are in lateral contact with the gate dielectric layers 112, and may or may not laterally protrude into the gate dielectric layers 112. Furthermore, although the isolation pillars 132 are depicted as separated from the conductive pillars 118 and the storage pillars 120, those skilled in the art may adjust positions of the conductive pillars 118, the storage pillars 120 and the isolation pillars 132, such that each isolation pillars 132 may be in lateral contact with adjacent conductive pillar 118 and storage pillar 120. The isolation walls 128, 130 and the isolation pillars 132 may respectively be formed of an insulating material, such as silicon oxide, silicon nitride, silicon oxynitride, the like or combinations thereof.

Figure 1C:
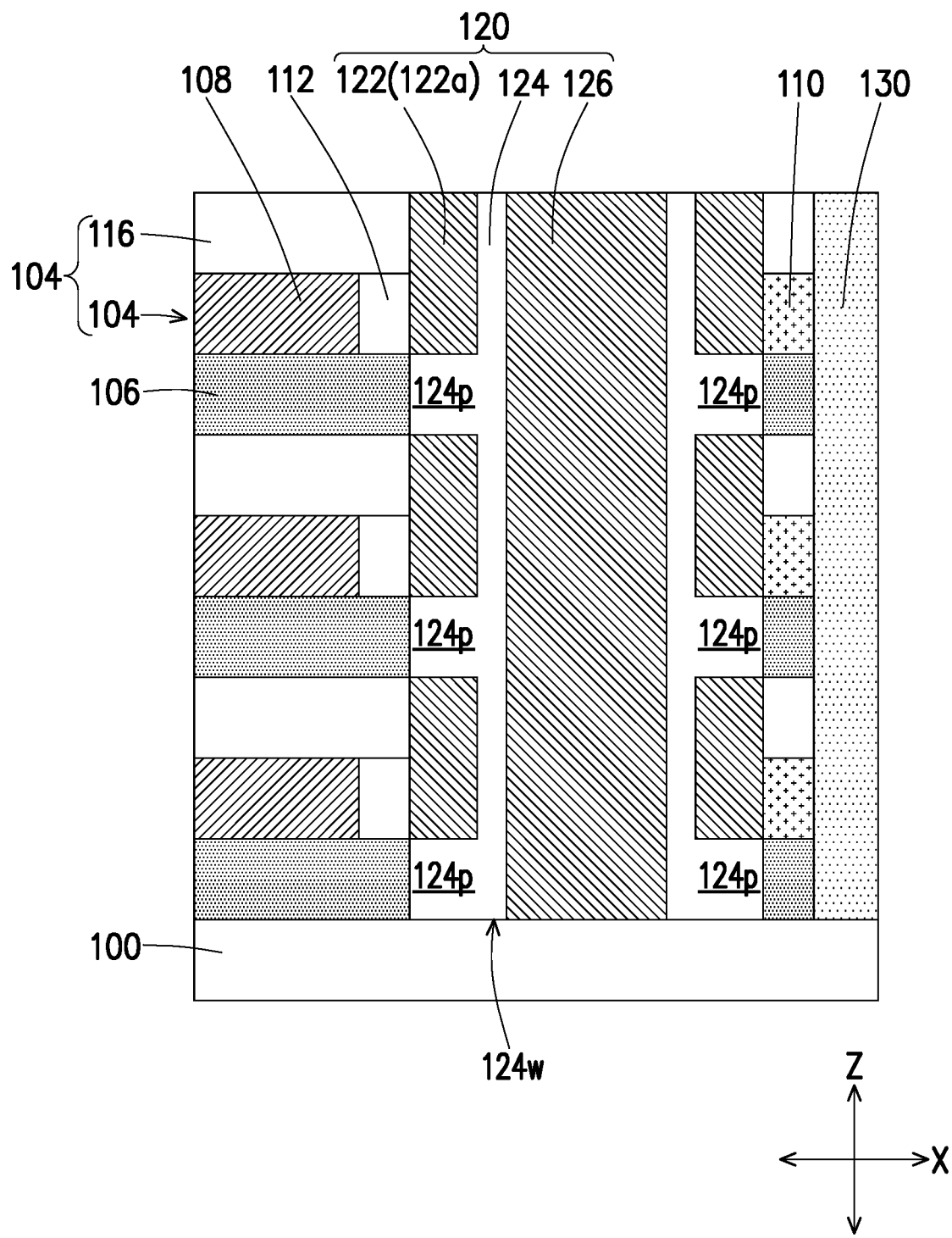
FIG. 1C is a schematic cross-sectional view along a line A-A' as shown in FIG. 1A.
Figure 1D:
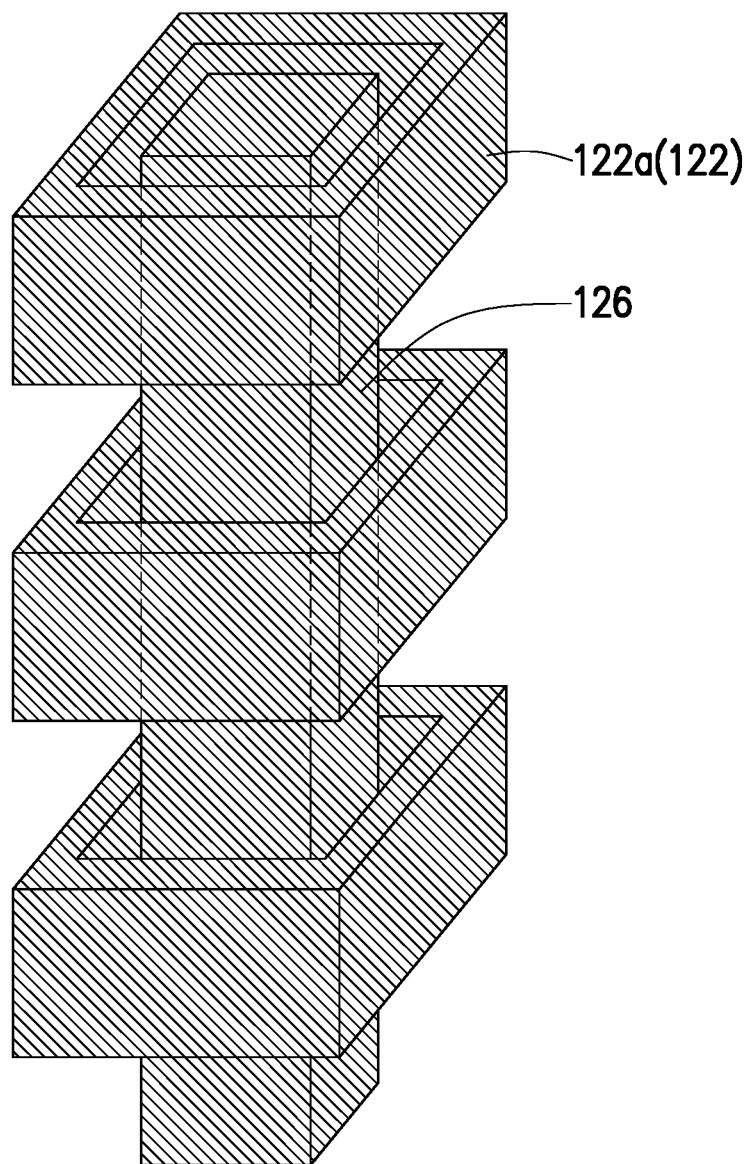
FIG. 1D is a schematic three-dimensional view illustrating an outer electrode and an inner electrode in one of the storage pillars as shown in FIG. 1A.

FIG. 1C is a schematic cross-sectional view along a line A-A' as shown in FIG. 1A. FIG. 1D is a schematic three-dimensional view illustrating the outer electrode 122 and the inner electrode 126 in one of the storage pillars 120 as shown in FIG. 1A.

Referring to FIG. 1A, FIG. 1C and FIG. 1D, the outer electrode 122 in each storage pillar 120 includes vertically separated annulus portions 122a. The annulus portions 122a may respectively be in lateral contact with one of the gate dielectric layers 112 and one of the channel layers 110 at the same height, as well as the isolation layer 116 in contact with these gate dielectric layer 112 and channel layer 110. On the other hand, the annulus portions 122a of the outer electrode 122 may not cover inner sidewalls of the spacer layers 106 due to the selective nature of the spacer layers 106. Alternately, the annulus portions 122a may partially cover the inner sidewalls of the spacer layers 106, but may not completely cover the inner sidewalls of the spacer layers 106, such that the annulus portions 122a in the same outer electrode 122 can be vertically separated from one another. Further, the inner electrode 126 of each storage pillar 120 continuously extends through the corresponding stacking structure 102, and is laterally surrounded by the annulus portions 122a of the outer electrode 122. In addition, the switching layer 124 is filled between the outer electrode 122 and the inner electrode 126, and between the annulus portions 122a of the outer electrode 122. As shown in FIG. 1C, the switching layer 124 has a wall portion 124w and protruded portions 124p laterally protruded from the wall portion 124w. The protruded portions 124p are filled between the vertically separated annulus portions 122a of the outer electrode 122, and in lateral contact with the spacer layers 106.

Figure 1E:
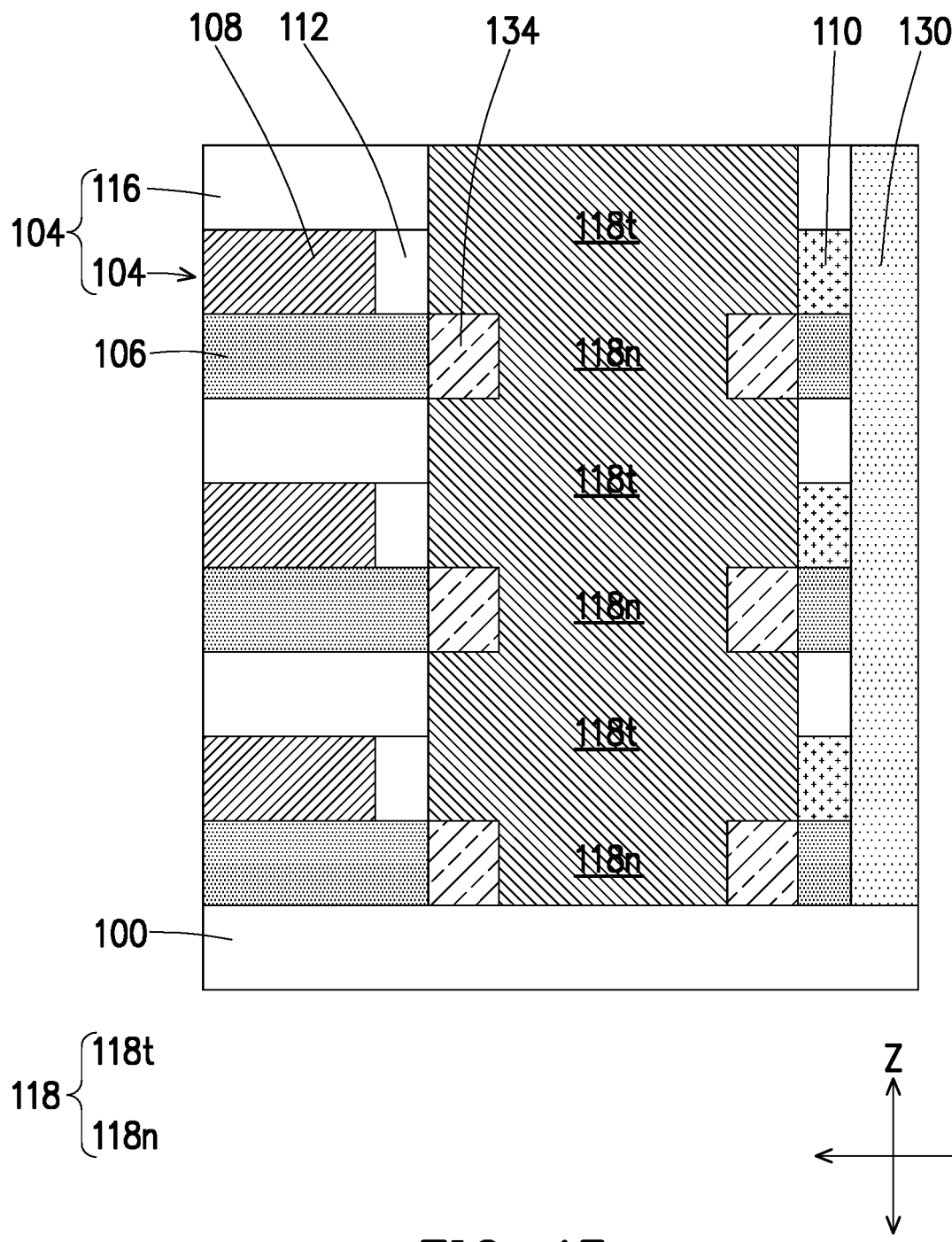
FIG. 1E is a schematic cross-sectional view along a line B-B' as shown in FIG. 1A.
Figure 1F:
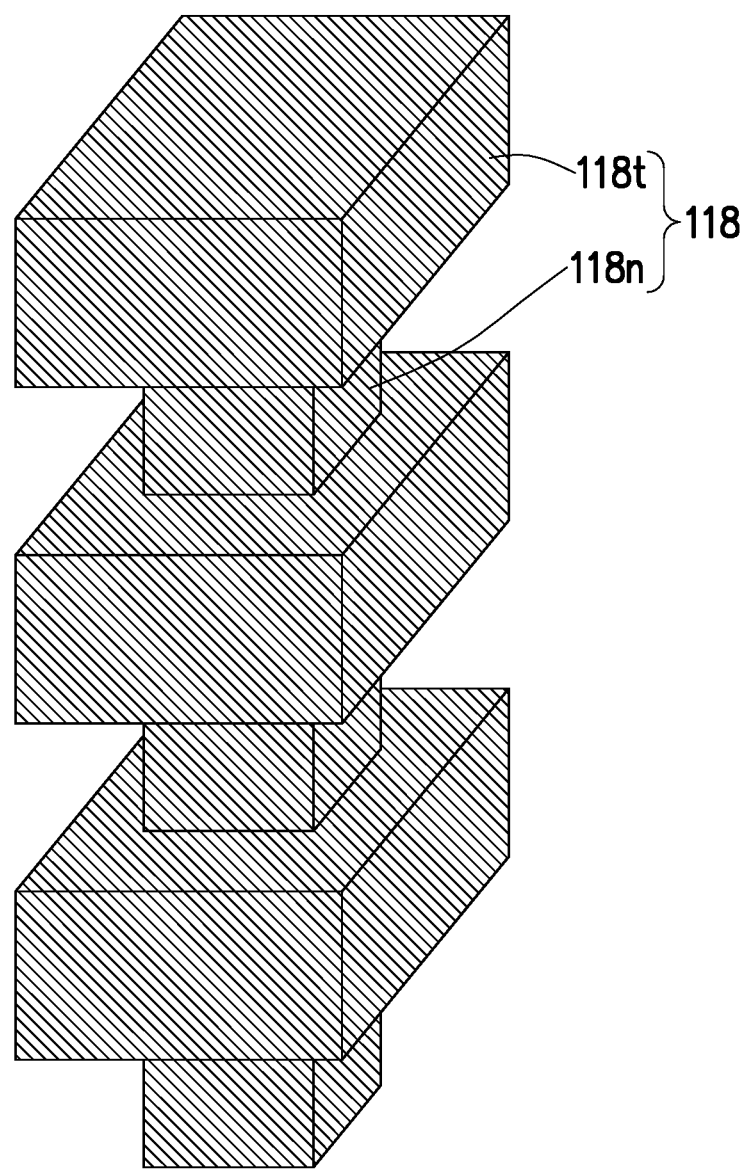
FIG. 1F is a schematic three-dimensional view of one of the conductive pillars as shown in FIG. 1A.

FIG. 1E is a schematic cross-sectional view along a line B-B' as shown in FIG. 1A. FIG. 1F is a schematic three-dimensional view of one of the conductive pillars 118 as shown in FIG. 1A.

Referring to FIG. 1A, FIG. 1E and FIG. 1F, the conductive pillars 118 respectively have thick portions 118t and narrow portions 118n alternately arranged along the vertical direction Z. The thick portions 118t of the conductive pillars 118 are in lateral contact with the composite layers 114 and the isolation layers 116, whereas the narrow portions 118n of the conductive pillars 118 are laterally surrounded by the spacer layers 106, and spaced apart from the spacer layers 106. In addition, the memory device 10 may further include annulus spacers 134. The annulus spacers 134 are respectively filled in a lateral recess defined between vertically adjacent thick portions 118t of one of the conductive pillars 118, and are in lateral contact with the spacer layers 106 and the narrow portions 118n of the conductive pillars 118. In other words, the narrow portions 118n of the conductive pillars 118 are in lateral contact with the spacer layers 106 through the annulus spacers 134. In some embodiments, outer sidewalls of the annulus spacers 134 are substantially coplanar with sidewalls of the thick portions 118t of the conductive pillar 118. The annulus spacers 134 may selectively formed on the inner sidewalls of the spacer layers 106, but may not cover inner sidewalls of the gate dielectric layers 112, the channel layers 110 and the isolation layers 116. Alternatively, the inner sidewalls of the gate dielectric layers 112, the channel layers 110 and the isolation layers 116 may be partially covered by the annulus spacers 134, but the inner sidewalls of the gate dielectric layers 112 and the channel layers 110 may not be completely covered by the annulus spacers 134. The annulus spacers 134 may be formed of an insulating material, thus can be selectively formed on the inner sidewalls of the spacer layers 106. By covering the inner sidewalls of the spacer layers 106 with the annulus spacers 134, the selective deposition surfaces for the conductive pillars 118 can be blocked, and the deposited conductive pillars 118 can continuously extend through the stacking structures 102. The conductive pillars 118, which continuously extend through the stacking structures 102, can be respectively functioned as a common source/drain terminal of a stack of the memory cells MC.

As described above, the memory cells MC in the memory device 10 are stackable, thus the memory device 10 is no longer limited by two-dimensional design, and a storage density of the memory device 10 can be significantly increased. Further, the memory cell MC is a 1T1R or 1T1C memory cell that uses the three-terminal access transistor AT. As compared to a two-terminal selector (e.g., an ovonic threshold switching (OTS) selector) that does not have a gate terminal, the three-terminal access transistor AT according to embodiments of the present disclosure has a gate terminal, and the gate terminal can be used to suppress leakage current. Accordingly, increasing threshold voltage of the access transistor AT for addressing the leakage issue is not necessary, thus unnecessary increase of operation voltage of the memory device 10 can be prevented. Moreover, the access transistor AT and the storage element SE in each memory cell MC share a common node (i.e., the outer electrode 122 of the storage pillar 120), and the common nodes of the memory cells MC in the same stack (i.e., vertically separated annulus portions 122a of the outer electrode 122) can be electrically isolated from one another.

Consequently, interference between vertically adjacent memory cells MC can be prevented.

Figure 2:
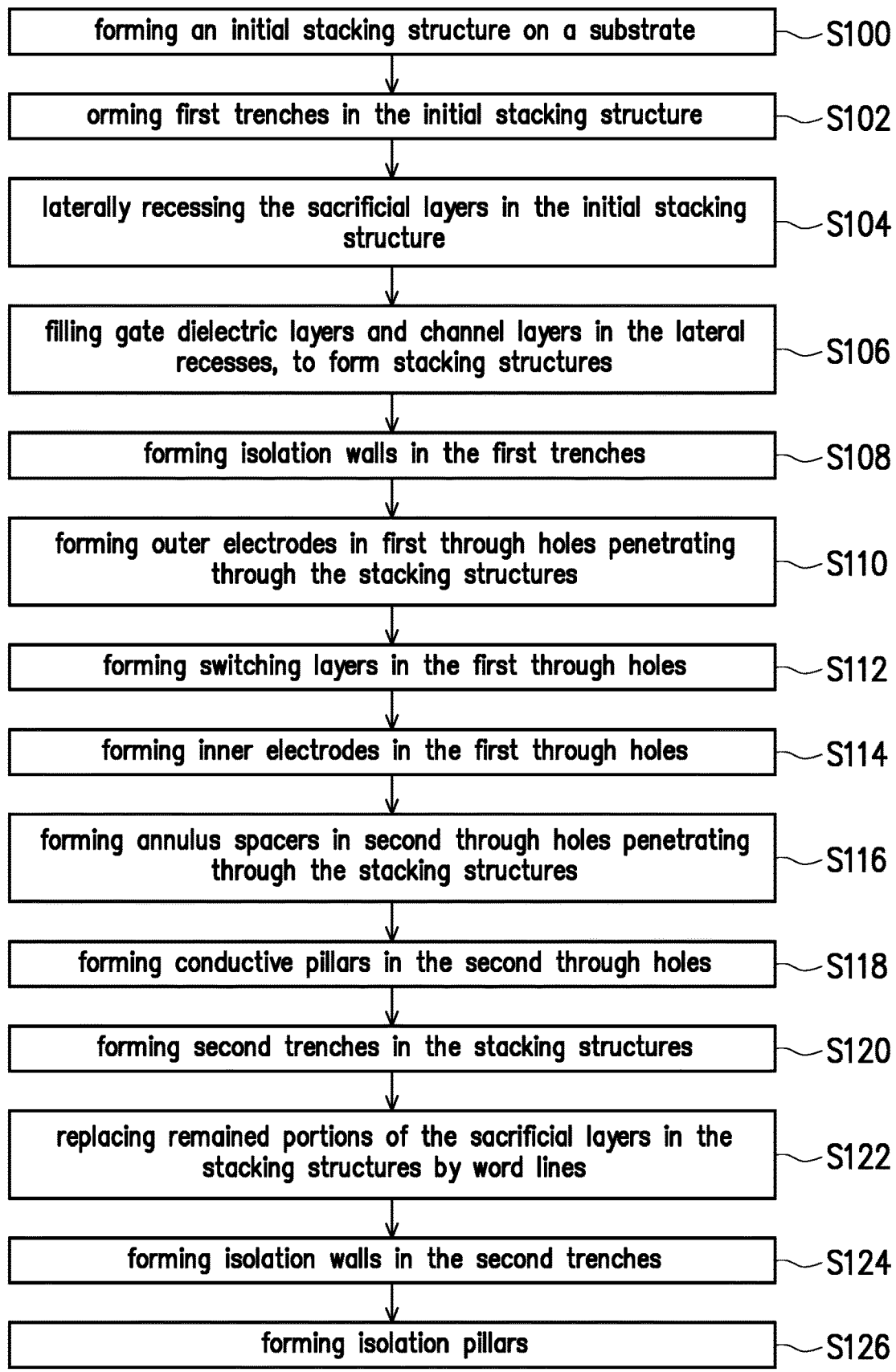
FIG. 2 is a flow diagram illustrating a manufacturing method for forming the memory device as shown in FIG. 1A.

FIG. 2 is a flow diagram illustrating a manufacturing method for forming the memory device 10 as shown in FIG. 1A. FIG. 3A through FIG. 3M are schematic three-dimensional views illustrating intermediate structures at various stages during the manufacturing process of the memory device 10 as shown in FIG. 2. FIG. 4A through FIG. 4C are schematic cross-sectional views along the line A-A' shown in FIG. 3F through FIG. 3H, respectively. FIG. 4D and FIG. 4E are schematic cross-sectional views along the line B-B' shown in FIG. 3I and FIG. 3J, respectively.

Figure 3A:
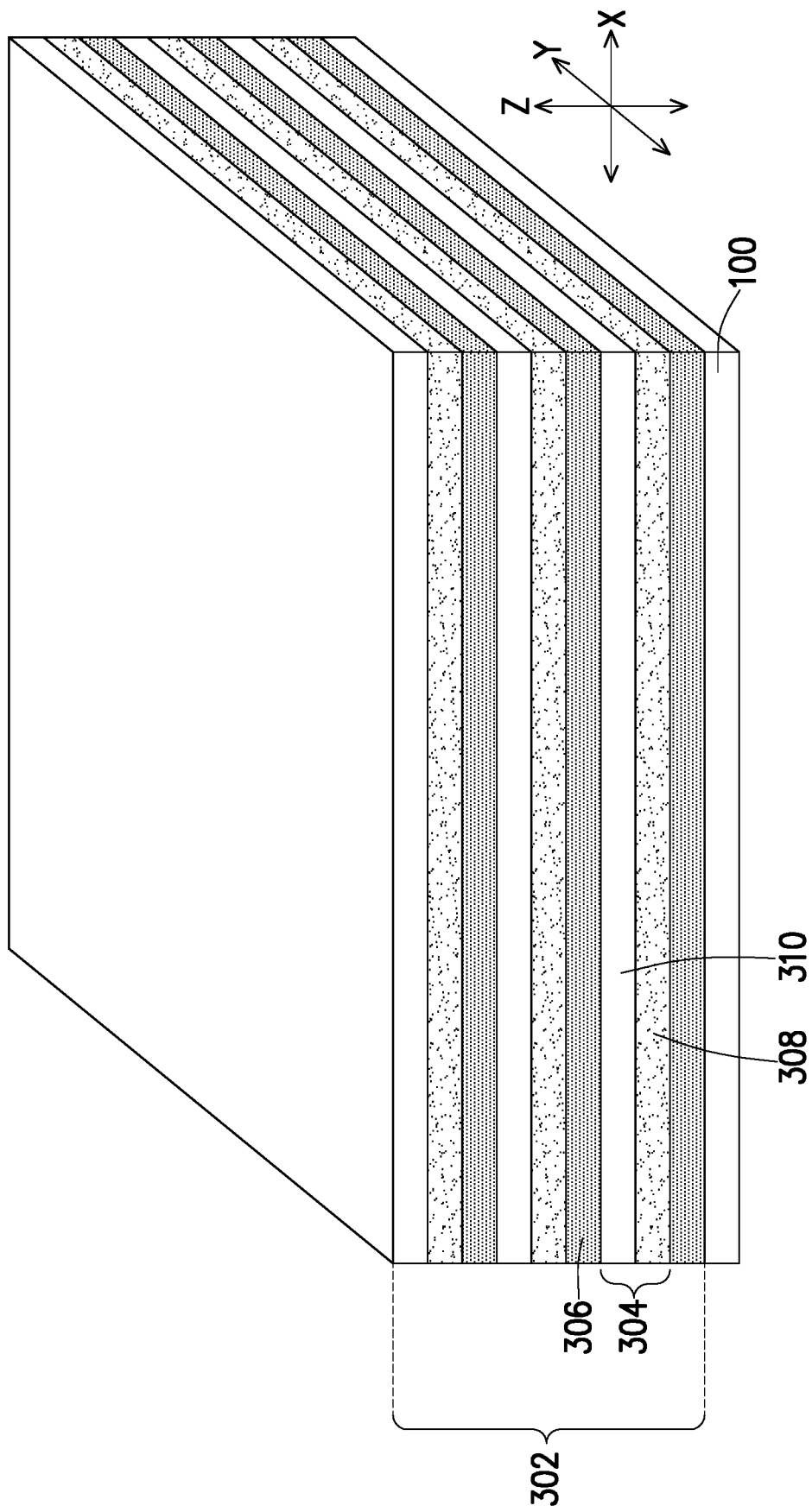
FIG. 3A through FIG. 3M are schematic three-dimensional views illustrating intermediate structures at various stages during the manufacturing process of the memory device as shown in FIG. 2.
Figure 4A:
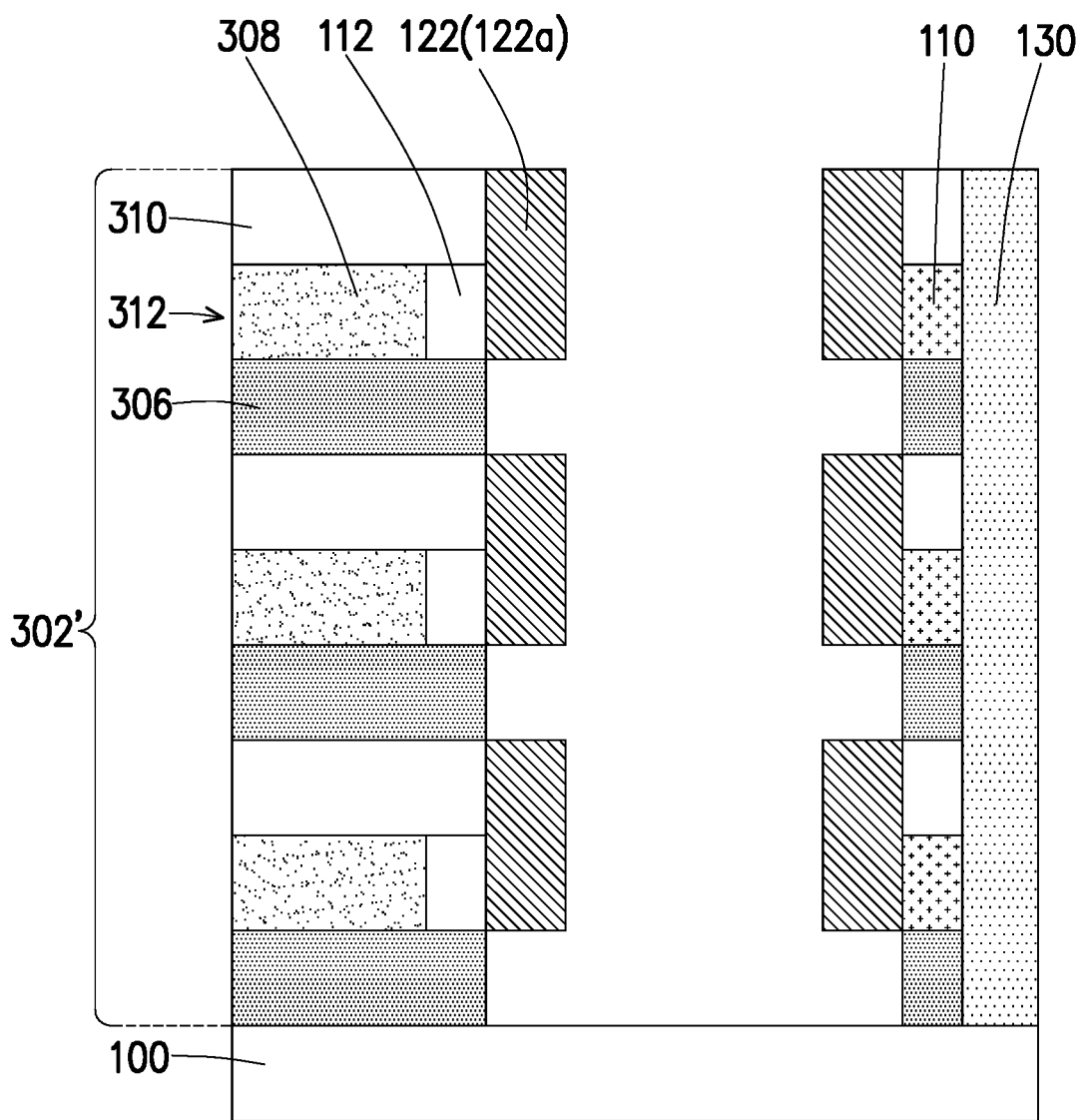
FIG. 4A through FIG. 4C are schematic cross-sectional views along the line A-A' shown in FIG. 3F through FIG. 3H, respectively.
Figure 4B:
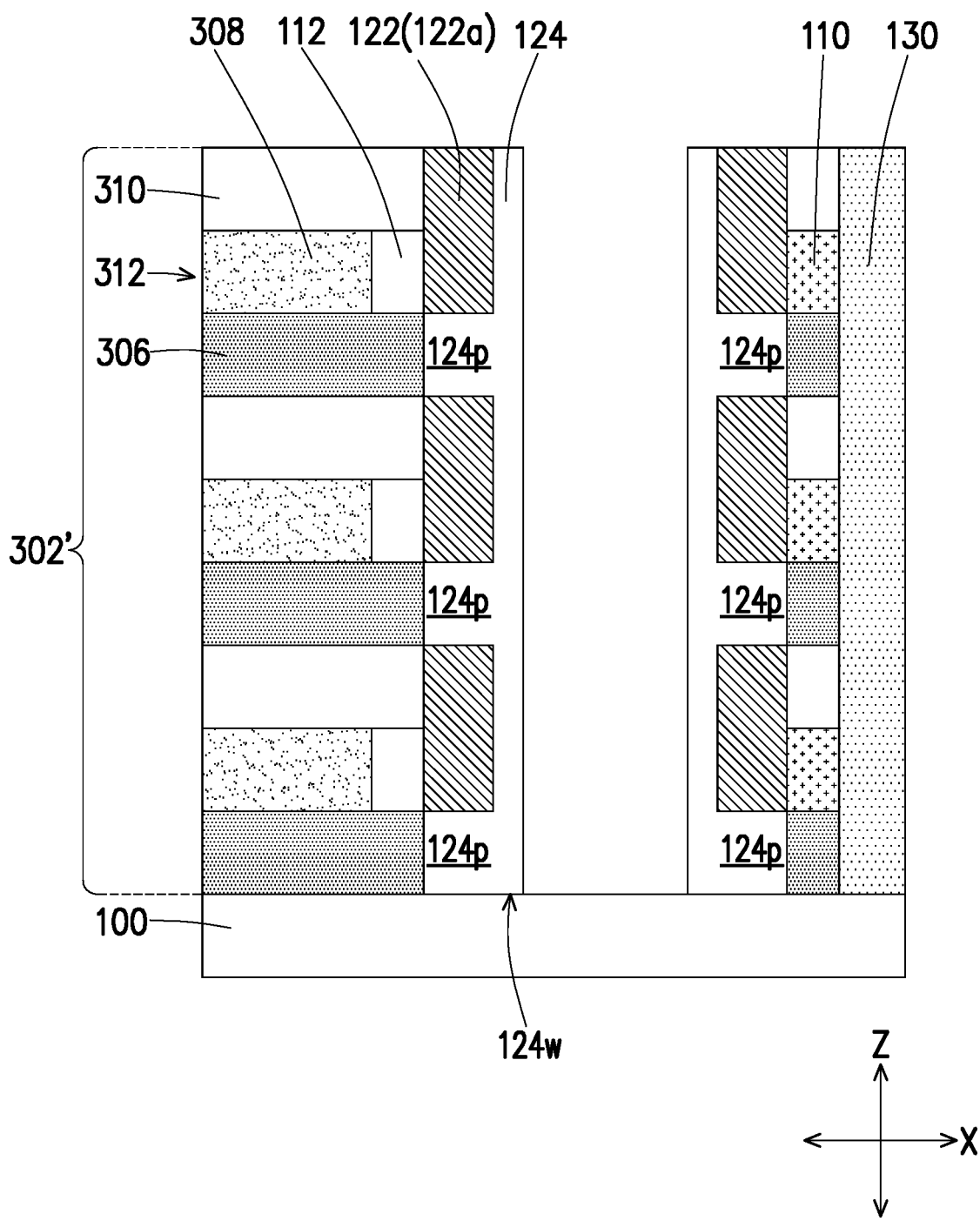
Figure 4C:
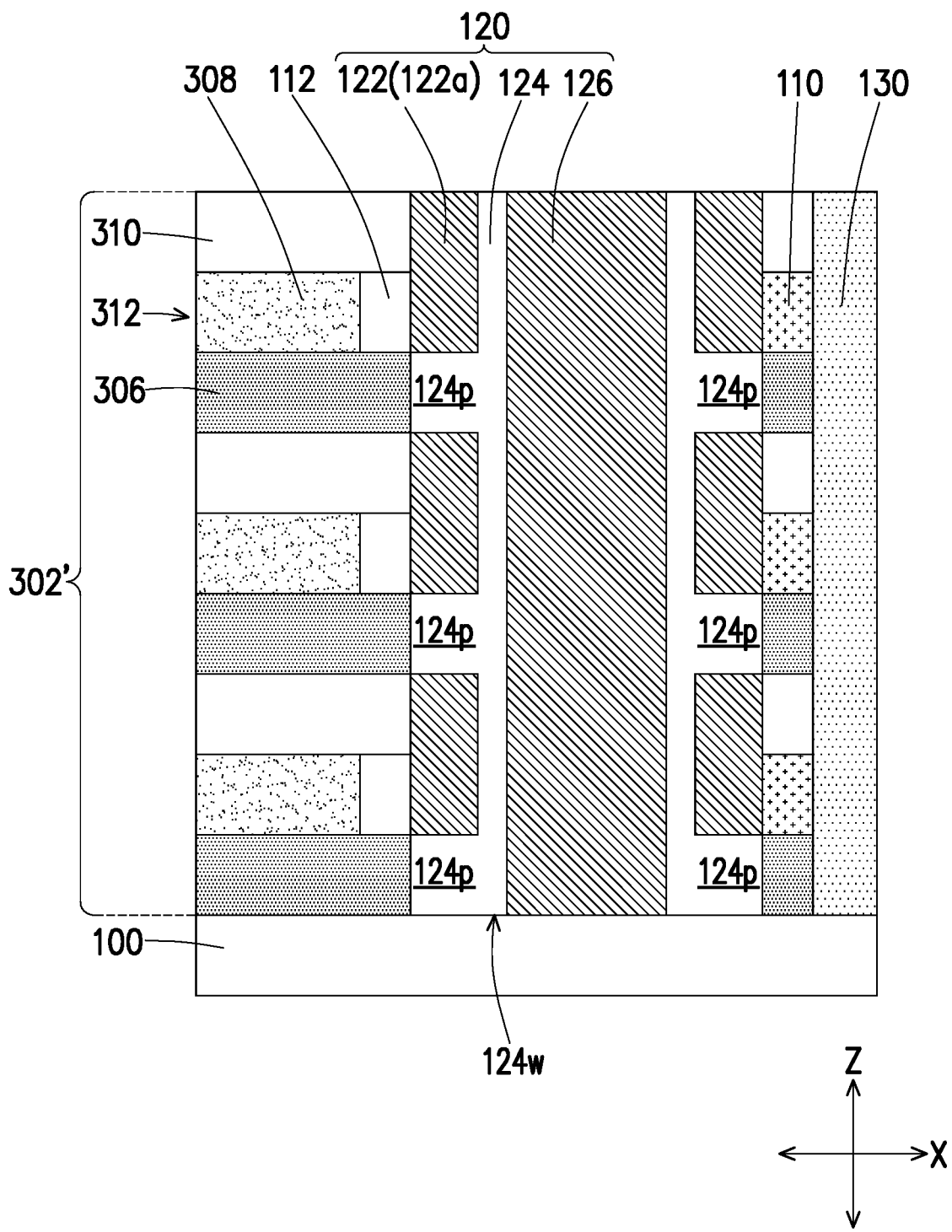
Figure 4D:
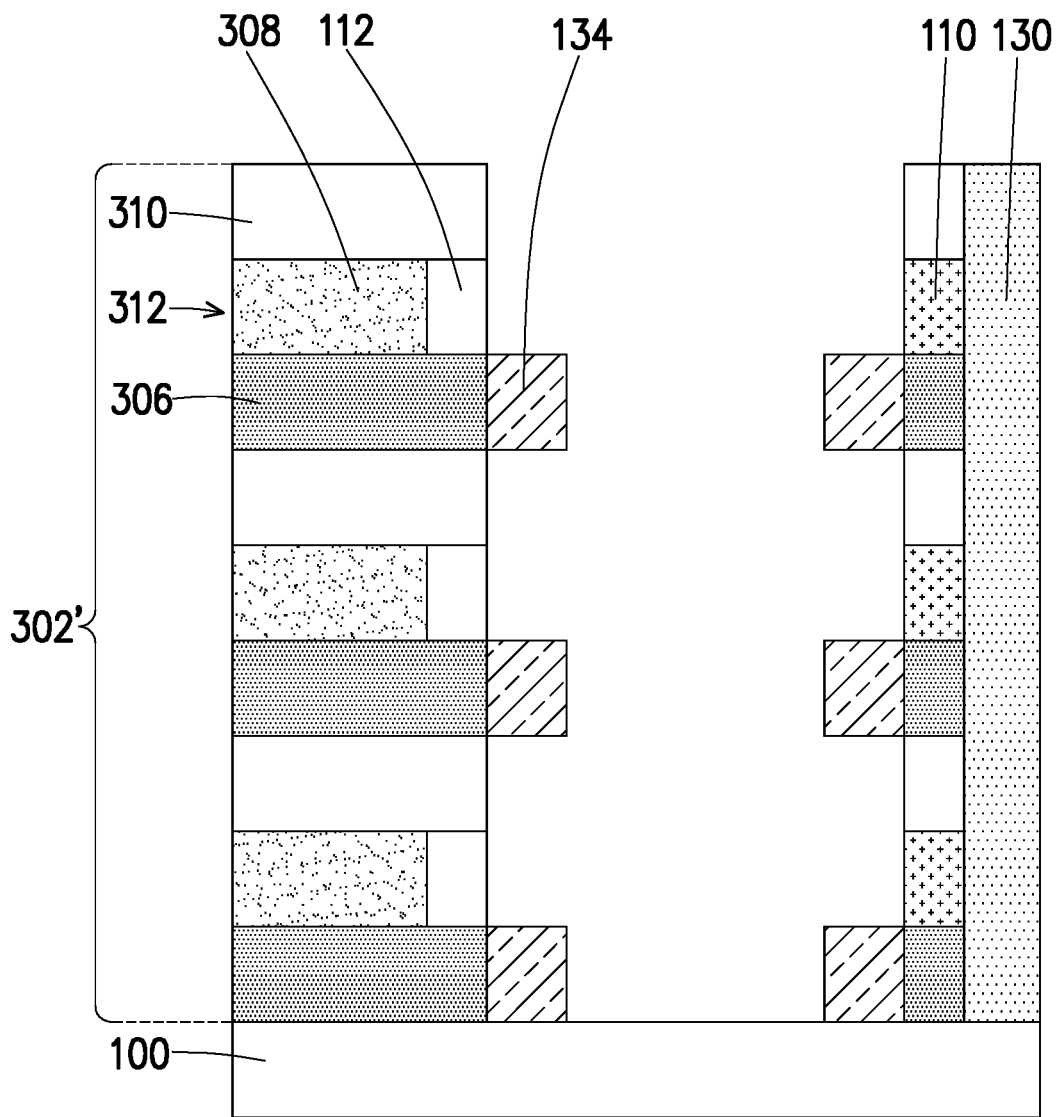
FIG. 4D and FIG. 4E are schematic cross-sectional views along the line B-B' shown in FIG. 3I and FIG. 3J, respectively.
Figure 4E:
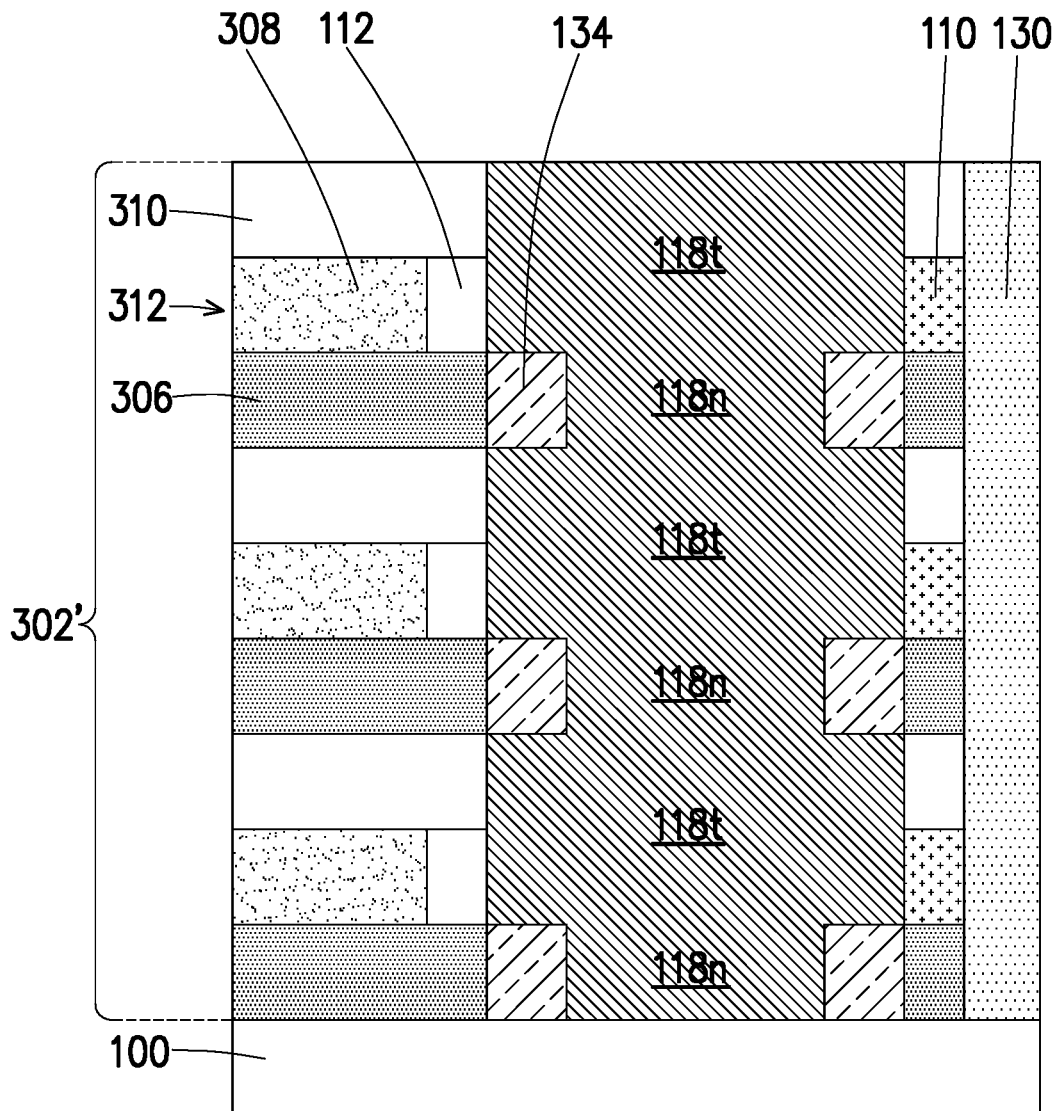

Referring to FIG. 2 and FIG. 3A, step S100 is performed, and an initial stacking structure 302 is formed on the substrate 100. The initial stacking structure 302 includes multiple film sets 304 stacked on the substrate 100, and includes spacer layers 306 separating the film sets 304 from one another. In some embodiments, a bottommost film set 304 is separated from the substrate 100 by a bottommost one of the spacer layers 306. Each film set 304 includes a sacrificial layer 308 and an isolation layer 310 stacked on or lying below the sacrificial layer 308. The sacrificial layer 308 will be patterned and replaced by the word line 108, the channel layer 110 and the gate dielectric layer 112 as described with reference to FIG. 1A. In addition, the isolation layer 310 will be patterned to form the isolation layer 116 as described with reference to FIG. 1A, and the spacer layer 306 will be patterned to form the spacer layer 106 as described with reference to FIG. 1A. The sacrificial layers 308 have sufficient etching selectivity with respect to the isolation layers 310 and the spacer layers 306, and the substrate 100 has sufficient etching selectivity with respect to the sacrificial layers 308, the isolation layers 310 and the spacer layers 306. In some embodiments, the substrate 100, the sacrificial layers 308, the isolation layers 310 and the spacer layers 306 are respectively formed by a deposition process, such as a chemical vapor deposition (CVD) process.

Figure 3B:
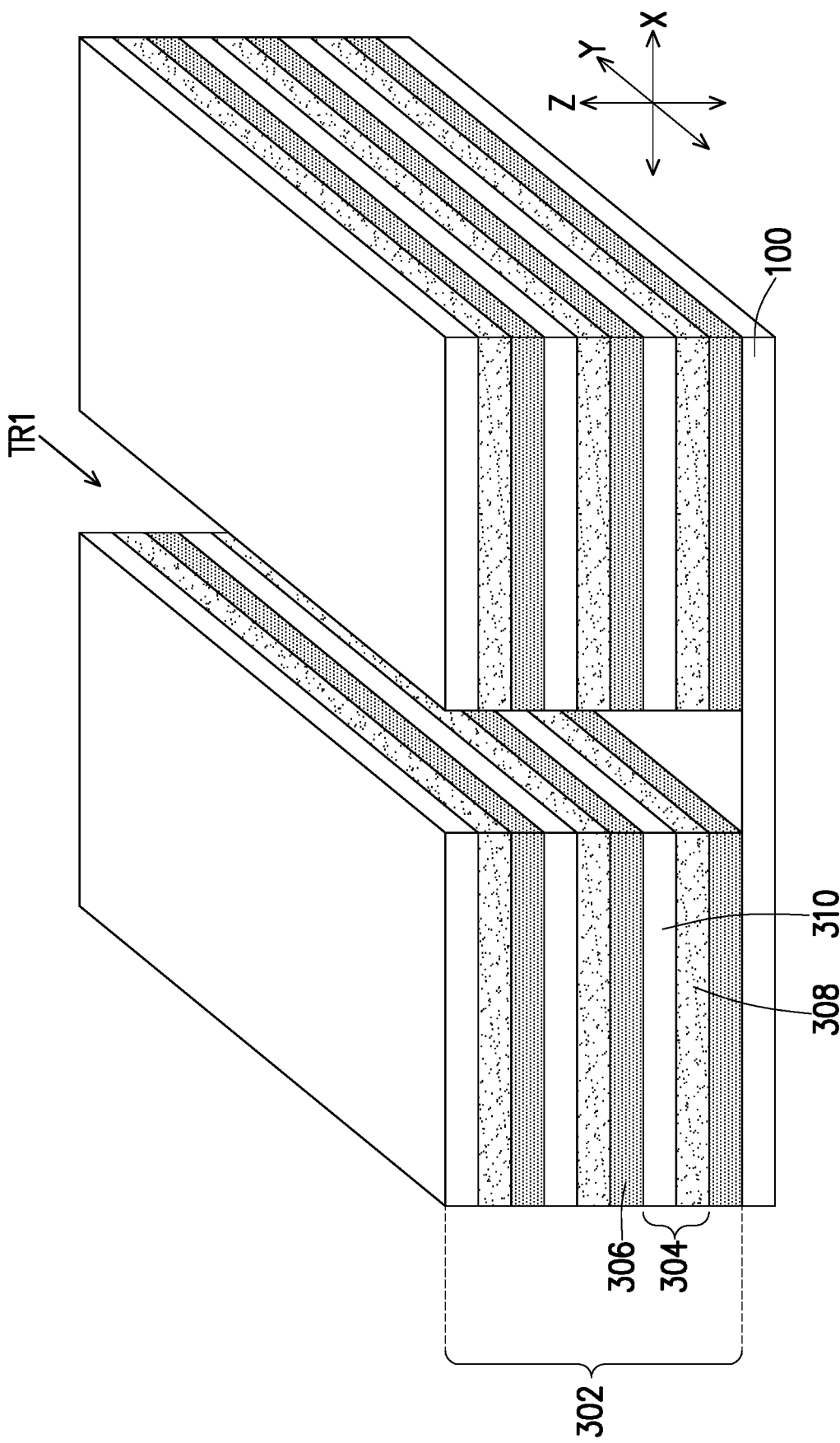

Referring to FIG. 2 and FIG. 3B, step S102 is performed, and trenches TR1 (only a single trench TR1 is depicted) are formed in the initial stacking structure 302. The trenches TR1 vertically penetrate through the initial stacking structure 302, and may extend along the direction Y. By forming the trenches TR1, the initial stacking structure 302 is cut into laterally separated portions, and portions of the substrate 100 between these laterally separated portions of the initial stacking structure 302 are currently exposed. In some embodiments, a method for forming the trench TR1 includes a lithography process and an etching process (e.g., an anisotropic etching process). Since the substrate 100 may have sufficient etching selectivity with respect to the sacrificial layers 308, the isolation layers 310 and the spacer layers 306, the substrate 100 may remain substantially intact during the etching process.

Figure 3C:
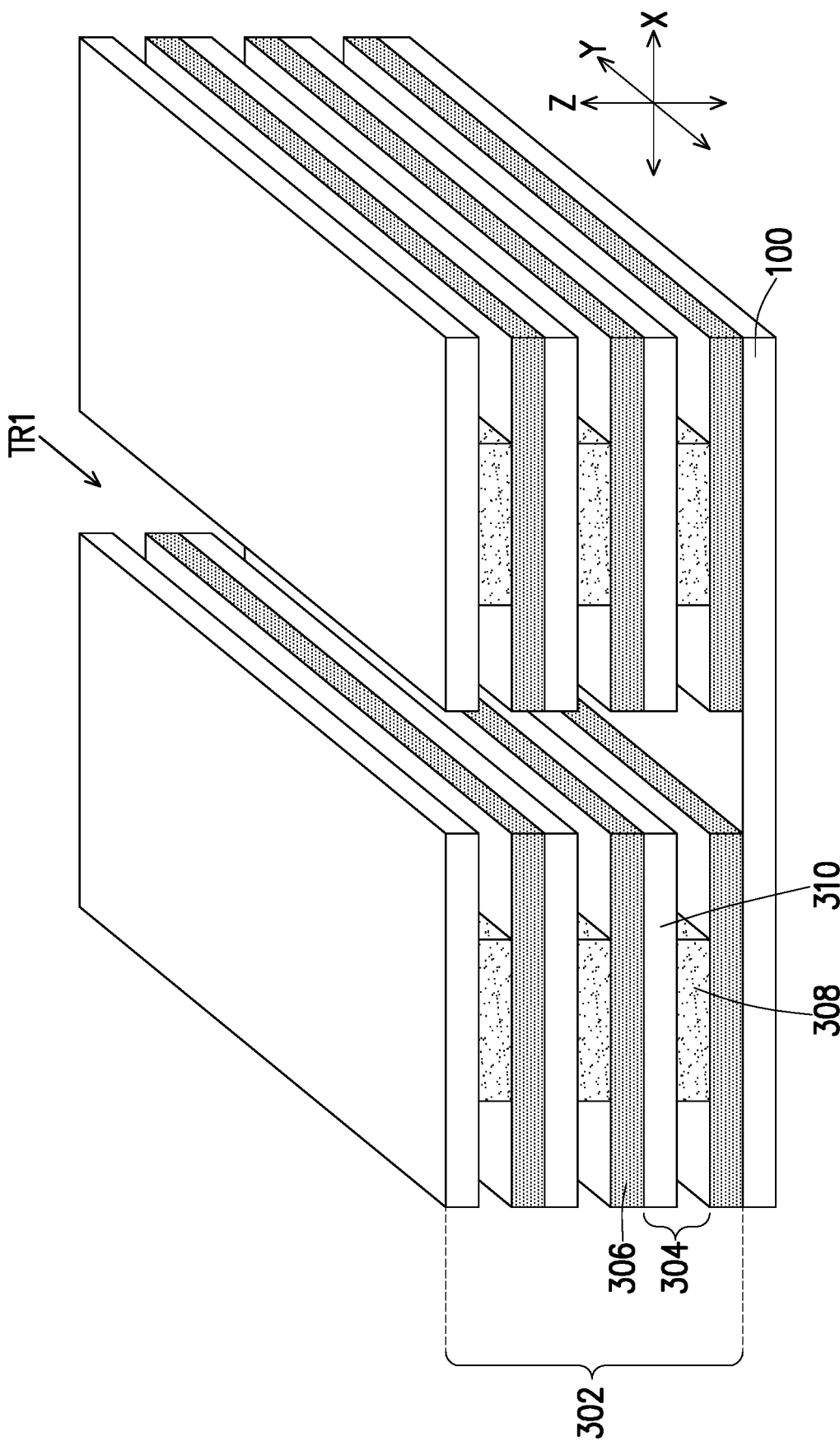

Referring to FIG. 2 and FIG. 3C, step S104 is performed, and the sacrificial layers 308 are laterally recessed. The sacrificial layers 308 are laterally recessed with respect to sidewalls of the isolation layers 310 and the spacer layers 306. In other words, portions of the sacrificial layers 308 close to the trenches TR1 are removed. Spaces previously occupied by these portions of the sacrificial layers 308 will be filled with the gate dielectric layers 112 and the channel layers 110, as will be described with reference to FIG. 3D. In some embodiments, a method for laterally recessing the sacrificial layers 308 includes an etching process, such as an isotropic etching process. Since the sacrificial layers 308 may have sufficient etching selectivity with respect to the isolation layers 310, the spacer layers 306 and the substrate 100, the isolation layers 310, the spacer layers 306 and the substrate 100 may remain substantially intact during such etching process.

Figure 3D:
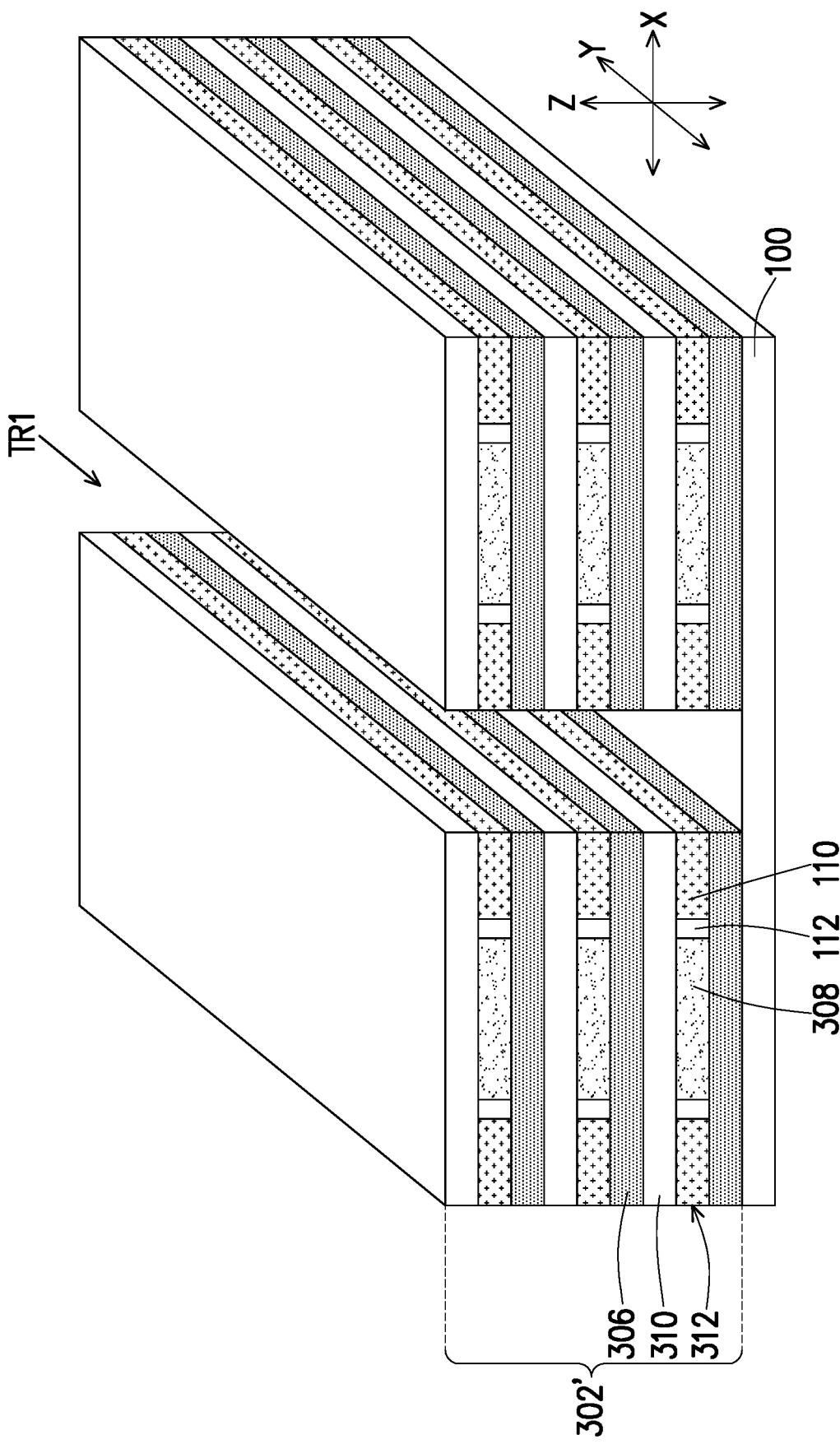

Referring to FIG. 2 and FIG. 3D, step S106 is performed, and gate dielectric layers 112 as well as the channel layers 110 are filled in the lateral recesses defined between the isolation layers 310 and the spacer layers 306. Each gate dielectric layer 112 is sandwiched between one of the sacrificial layers 308 and one of the channel layers 110. In some embodiments, sidewalls of the channel layers 110 facing away from the gate dielectric layers 112 are substantially coplanar with the sidewalls of the isolation layers 310 and the spacer layers 306. The sacrificial layer 308, the gate dielectric layers 112 and the channel layers 110 sandwiched between one of the isolation layers 310 and one of the spacer layers 306 form a composite layer 312. In addition, the composite layers 312, the isolation layers 310 and the spacer layers 306 located between adjacent trenches TR1 become a stacking structure 302'. In some embodiments, a method for forming the gate dielectric layers 112 and the channel layers 110 includes forming a dielectric material layer (not shown) globally covering exposed surfaces of the structure shown in FIG. 3C by a deposition process (e.g., a CVD process or an atomic layer deposition (ALD) process), and performing one or more etching process(es) (e.g., an isotropic etching process or a combination of an anisotropic etching process and an isotropic etching process) on the dielectric material layer. Remained portions of the dielectric material layer may form the gate dielectric layers 112. Subsequently, a semiconducting material layer (not shown) is globally formed on exposed surfaces of the current structure by a deposition process (e.g., a CVD process or an ALD process), and portions of the semiconducting material layer in the trenches TR1 and above the stacking structures 302/302' are then removed by, for example, a combination of an etching process (e.g., an anisotropic etching process) and a planarization process (e.g., a polishing process). Remained portions of the semiconducting material layer form the channel layers 110.

Figure 3E:
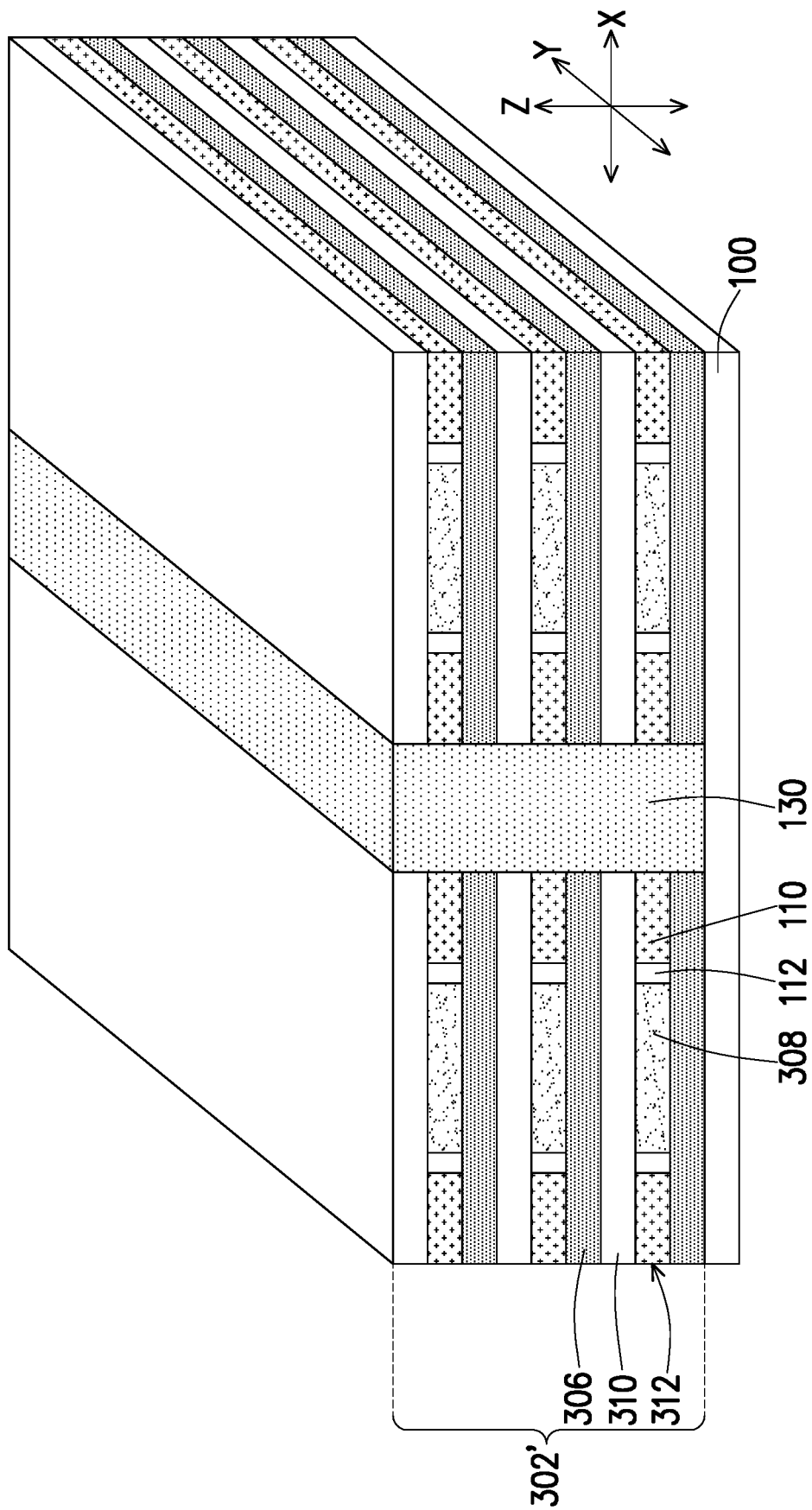

Referring to FIG. 2 and FIG. 3E, step S108 is performed, and the isolation walls 130 (only a single isolation wall 130 is depicted) are formed in the trenches TR1. In some embodiments, a method for forming the isolation walls 130 includes providing an insulating material on the structure shown in FIG. 3D by a deposition process (e.g., a CVD process). Subsequently, portions of the insulating material above the stacking structures 302' are removed by a polishing process. Remained portions of the insulating material in the trenches TR1 may form the isolation walls 130.

Figure 3F:
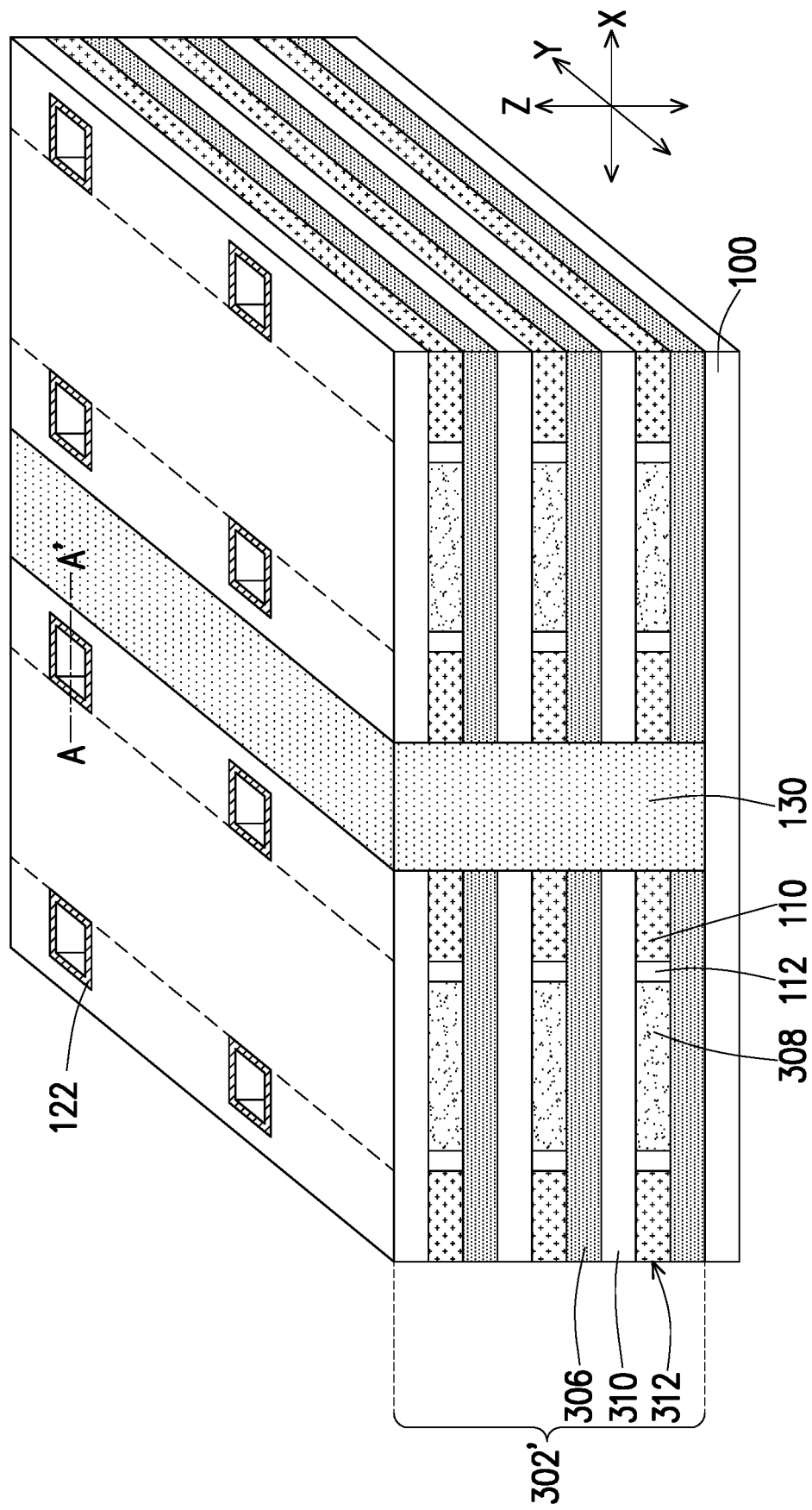

Referring to FIG. 2, FIG. 3F and FIG. 4A, step S110 is performed, and the outer electrodes 122 of the storage pillars 120 as described with reference to FIG. 1A are formed. The outer electrodes 122 are formed in through holes penetrating through the stacking structures 302'. The channel layers 110 in the stacking structures 302' are penetrated through by the through holes.

In addition, sidewalls of the gate dielectric layers 112 in the stacking structures 302' and facing away from the sacrificial layers 308 may be exposed at sidewalls of the through holes, along with inner sidewalls of the channel layers 110, the isolation layers 310 and the spacer layer 306. As described with reference to FIG. 1A, FIG. 1C and FIG. 1D, each outer electrode 122 has the vertically separated annulus portions 122a. The annulus portions 122a of the outer electrodes 122 may not cover the exposed surfaces of the spacer layers 306. Alternatively, the annulus portions 122a of the outer electrodes 122 may partially cover the exposed surfaces of the spacer layers 306, but may not completely cover these surfaces, such that the annulus portions 122a can be prevented from being in contact with one another. In some embodiments, a method for forming the outer electrodes 122 includes forming the through holes in the stacking structures 302' by a lithography process and an etching process (e.g., an anisotropic etching process), and includes forming a conductive material in these through holes by a deposition process, such as an ALD process. As a result of the selective nature of the spacer layers 306, the exposed surfaces of the spacer layers 306 can be avoided (at least partially) from being deposited by the conductive material, and the exposed surfaces of the spacer layers 306 may maintain exposed (at least partially) after deposition of the conductive material. Thereafter, portions of the conductive material lying on the bottom surfaces of the through holes and above the stacking structures 302' may be removed by an etching process (e.g., an anisotropic etching process). Remained portions of the conductive material at sidewalls of the through holes form the annulus portions 122a of the outer electrodes 122.

Figure 3G:
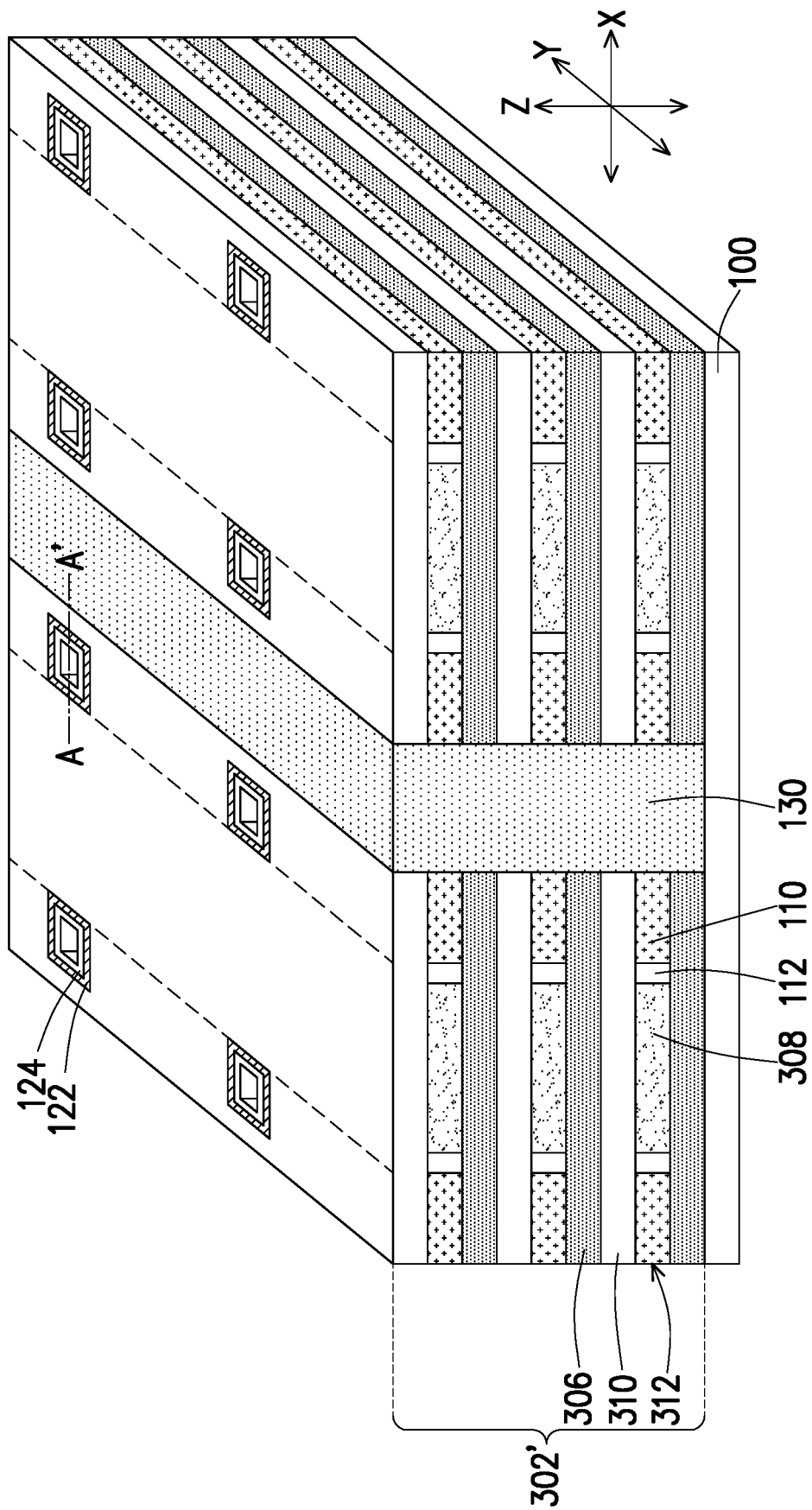

Referring to FIG. 2, FIG. 3G and FIG. 4B, step S112 is performed, and the switching layers 124 of the storage pillars 120 as described with reference to FIG. 1A are formed. The wall portion 124w of the switching layer 124 may be in a tube shape, and is laterally surrounded by the annulus portions 122a of the outer electrode 122. In addition, the switching layer 124 may further include the protruded portions 124p laterally protruded from an outer sidewall of the wall portion 124w of the switching layer 124. The protruded portions 124a are filled in between the annulus portions 122a of the outer electrode 122, and in lateral contact with the exposed surfaces of the spacer layers 306. In some embodiments, a method for forming the switching layers 124 includes forming a switching material in the through holes by a deposition process, such as an ALD process or a CVD process. Subsequently, an etching process (e.g., an anisotropic etching process) or a combination of the etching process and a polishing process is performed to remove undesired portions of the switching material. Remained portions of the switching material form the switching layers 124.

Figure 3H:
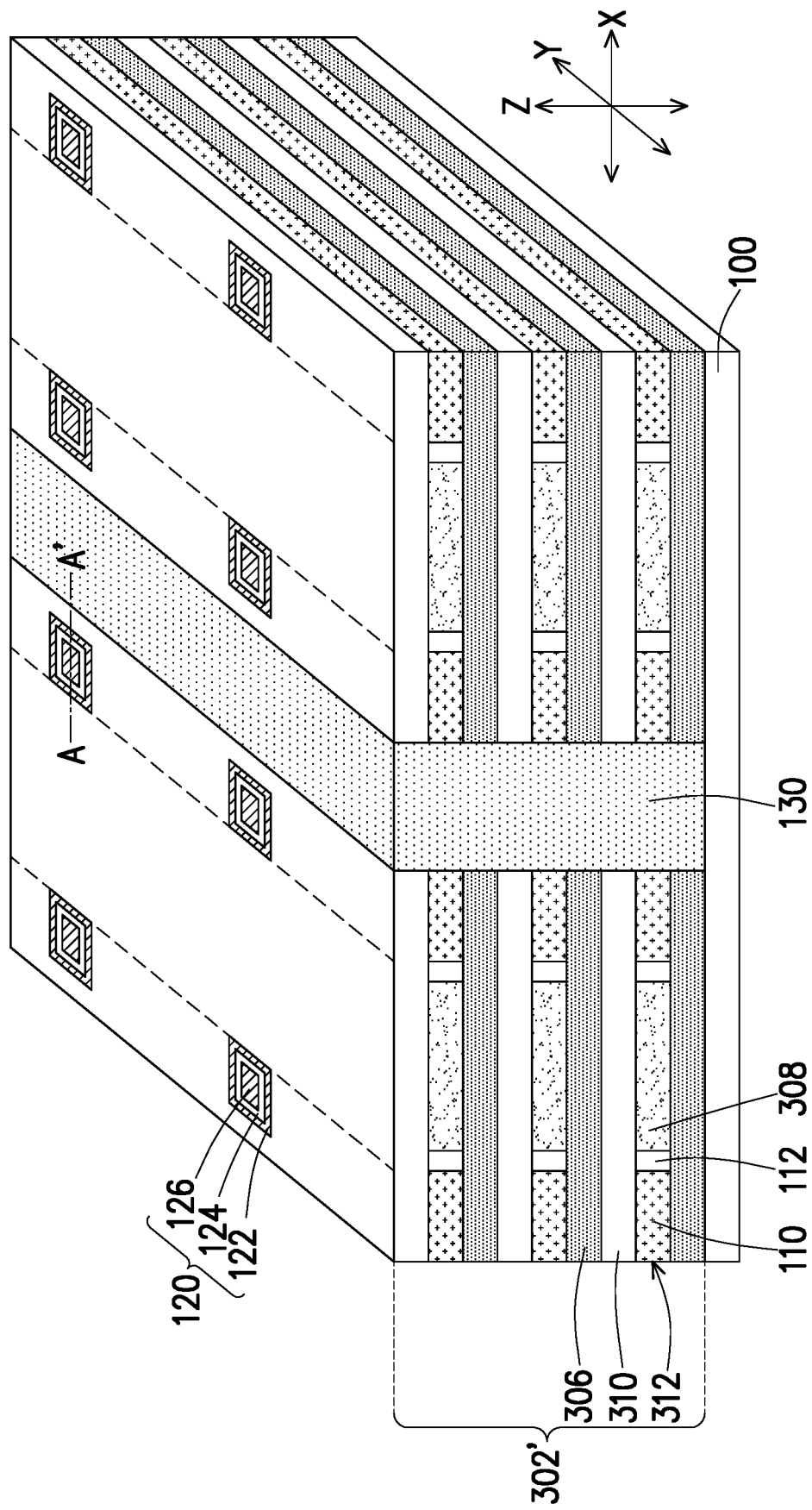

Referring to FIG. 2, FIG. 3H and FIG. 4C, step S114 is performed, and the inner electrodes 126 of the storage pillars 120 as described with reference to FIG. 1A are formed. The inner electrodes 126 fill up the through holes, and are laterally surrounded by the switching layers 124, respectively. In some embodiments, a method for forming the inner electrodes 126 includes filling a conductive material into the through holes by a deposition process (e.g., a physical vapor deposition (PVD) process, a CVD process or an ALD process), a plating process or a combination thereof. Subsequently, a polishing process, an etching process (e.g., an isotropic etching process or an anisotropic etching process) or a combination thereof is performed for removing portions of the conductive material above the stacking structures 302'. Accordingly, remained portions of the conductive material are located in the through holes, and form the inner electrodes 126.

Figure 3I:
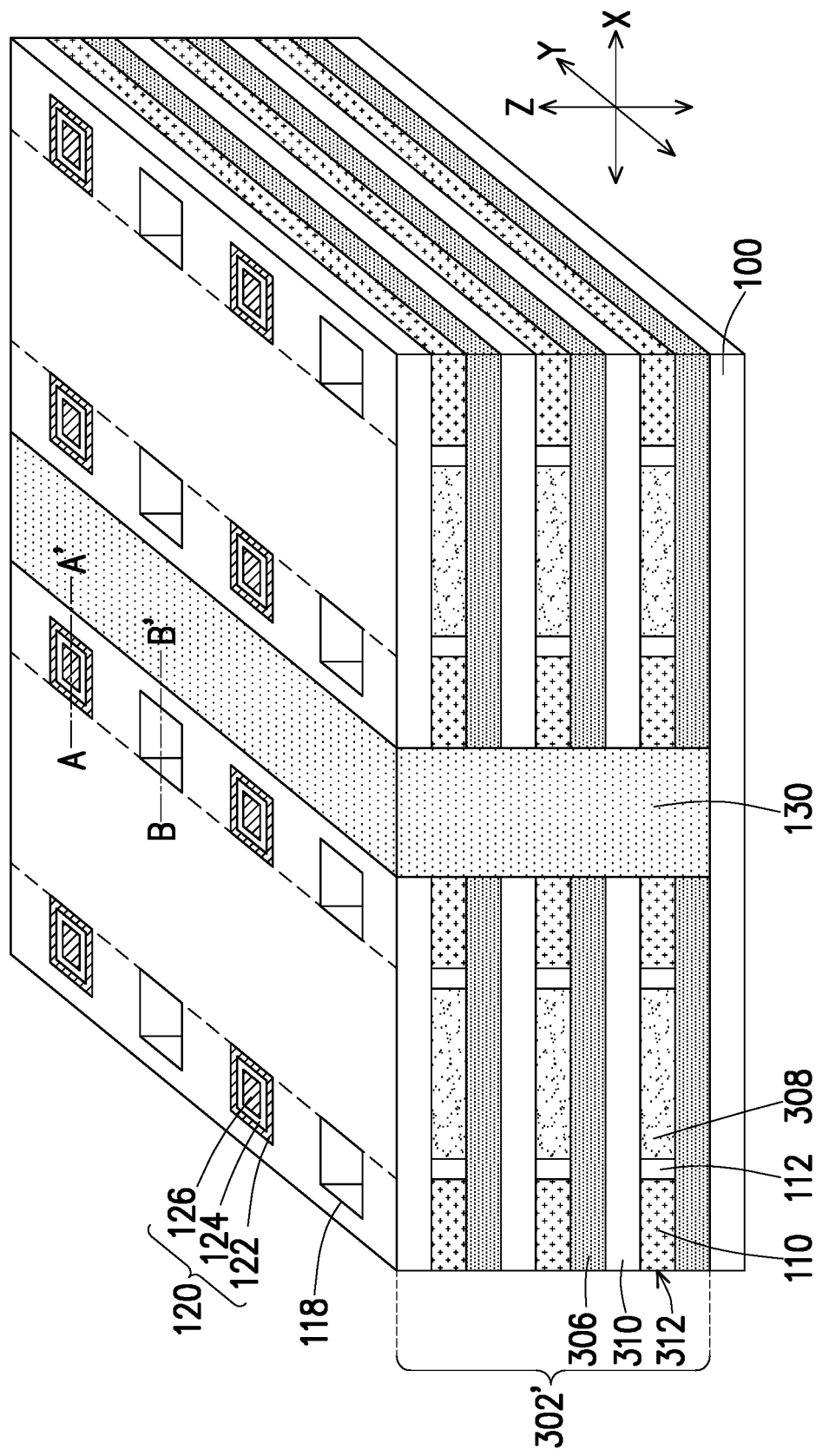
Figure 3J:
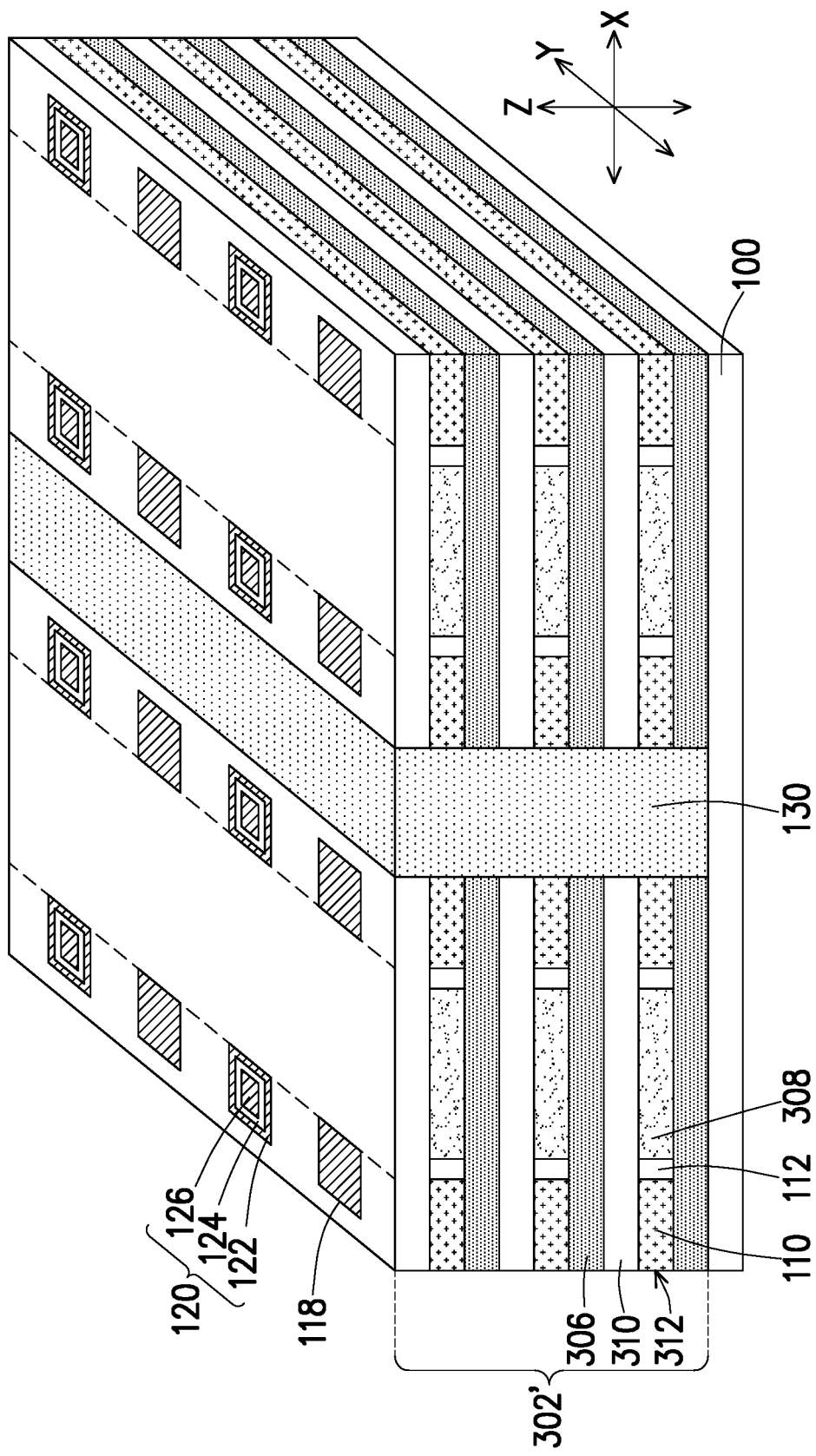

Referring to FIG. 2, FIG. 3I and FIG. 4D, step S116 is performed, and the annulus spacers 134 are formed in through holes for accommodating the conductive pillars 118 to be formed in the following step (as shown in FIG. 3J and FIG. 4E). As similar to the through holes for accommodating the storage pillars 120, the through holes in which the annulus spacers 134 are formed penetrate through the stacking structures 302'. The channel layers 110 in the stacking structures 302' are penetrated through by the through holes. In addition, sidewalls of the gate dielectric layers 112 in the stacking structures 302' and facing away from the sacrificial layers 308 may be exposed at sidewalls of the through holes, along with inner sidewalls of the channel layers 110, the isolation layers 310 and the spacer layer 306. The annulus spacers 134 may be formed on the exposed surfaces of the spacer layers 306, and may not extend to the exposed surfaces of the channel layers 110, the gate dielectric layers 112 and the isolation layers 310. Alternatively, the annulus spacers 134 may extend to the exposed surfaces of the channel layers 110, the gate dielectric layers 112 and the isolation layers 310, but may not completely cover the exposed surfaces of the channel layers 110. In some embodiments, a method for forming the annulus spacers 134 includes forming an insulating material in the through holes by a deposition process, such as a CVD process or an ALD process. Subsequently, an etching process (e.g., an anisotropic etching process) or a combination of the etching process and a polishing process is performed to remove undesired portions of the insulating material. The remained portions of the insulating material form the annulus spacers 134.

Referring to FIG. 2, FIG. 3J and FIG. 4E, step S118 is performed, and the conductive pillars 118 are formed in the through holes accommodating the annulus spacers 134. The conductive pillars 118 may fill up these through holes. As described with reference to FIG. 1A, FIG. 1E and FIG. 1F, the conductive pillars 118 respectively have the thick portions 118t and the narrow portions 118n. The annulus spacers 134 laterally surround the narrow portions 118n, and located between the thick portions 118t. In some embodiments, a method for forming the conductive pillars 118 includes filling a conductive material into the through holes by a deposition process (e.g., a PVD process, a CVD process or an ALD process), a plating process or a combination thereof. Subsequently, a polishing process, an etching process (e.g., an isotropic etching process or an anisotropic etching process) or a combination thereof is performed for removing portions of the conductive material above the stacking structures 302'. Accordingly, remained portions of the conductive material are located in the through holes, and form the conductive pillars 118.

In embodiments described above, the conductive pillars 118 as well as the annulus spacers 134 are formed after formation of the storage pillars 120. However, in alternative embodiments, the conductive pillars 118 as well as the annulus spacers 134 are formed before formation of the storage pillars 120. In these embodiments, steps S116, S118 are performed before steps S110, S112, S114.

Figure 3K:
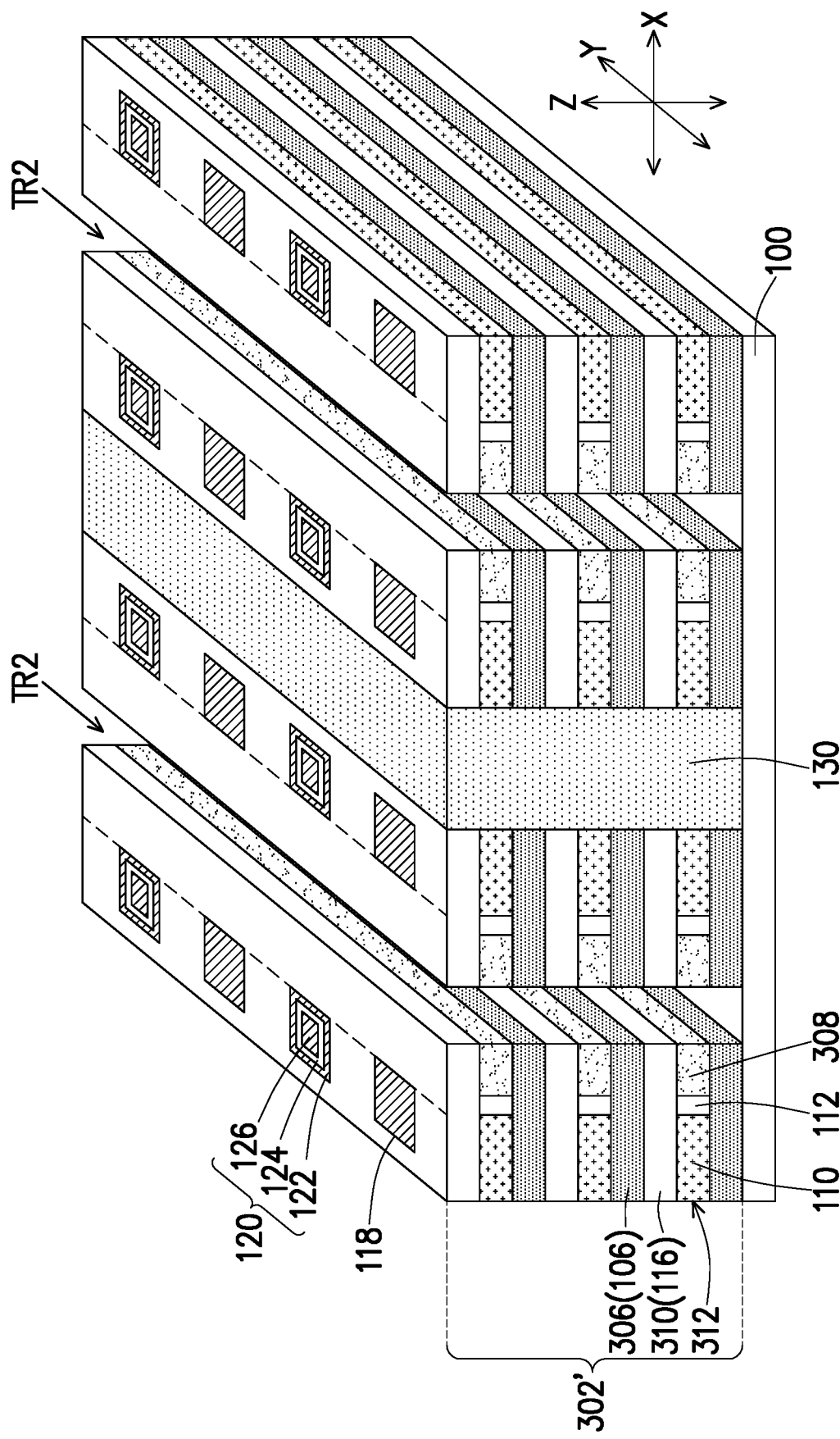

Referring to FIG. 2 and FIG. 3K, step S120 is performed, and trenches TR2 are formed in the stacking structures 302'. Each stacking structure 302' is divided into separated portions by one of the trenches TR2. The trenches TR2 may extend along the direction Y, and are respectively located between adjacent ones of the isolation walls 130. The sacrificial layers 308 in the stacking structures 302' are respectively cut into separated lines by the trenches TR2, along with the isolation layers 310 and the spacer layers 306. Accordingly, the remained portions of the sacrificial layers 308, the isolation layers 310 and the spacer layers 306 are exposed at sidewalls of the trenches TR2. The remained portions of the spacer layers 306 become the spacer layers 106 as described with reference to FIG. 1A, and the remained portions of the isolation layers 310 become the isolation layers 116 as described with reference to FIG. 1A.

On the other hand, the gate dielectric layers 112 and the channel layers 110 may be spaced apart from the trenches TR2. In some embodiments, a method for forming the trenches TR2 may include a lithography process and an etching process (e.g., an anisotropic etching process).

Figure 3L:
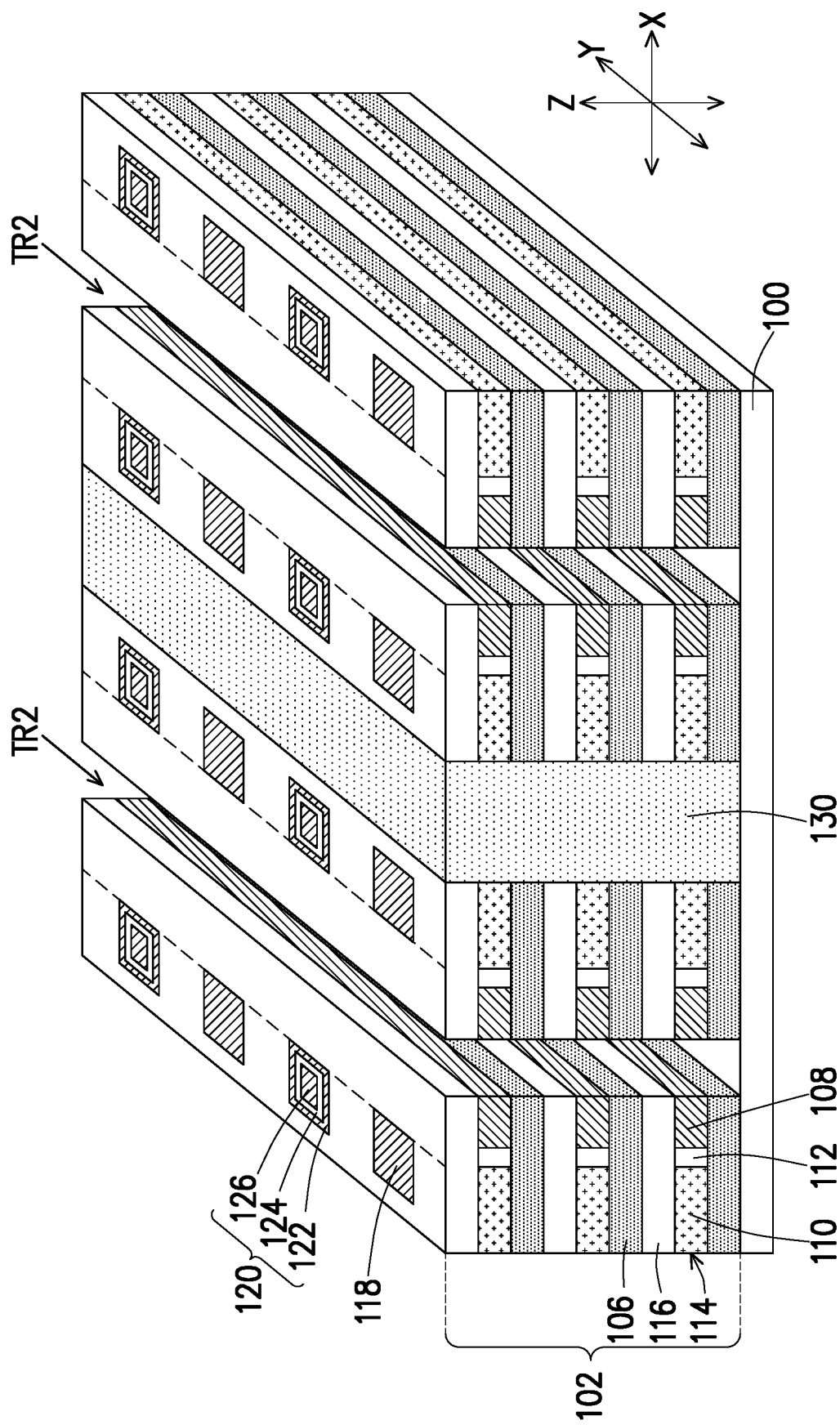

Referring to FIG. 2 and FIG. 3L, step S122 is performed, and remained portions of the sacrificial layers 308 are replaced by the word lines 108. After such replacement, the stacking structures 302' become the stacking structures 102 as described with reference to FIG. 1A. In some embodiments, a method for replacing the sacrificial layers 308 with the word lines 108 includes removing the sacrificial layers 308 by an etching process, such as an isotropic etching process. Since the sacrificial layers 308 may have sufficient etching selectivity with respect to the isolation layers 116, the spacer layers 106, the gate dielectric layers 112 and the substrate 100, these layers may remain substantially intact during the etching process. Also, since the channel layers 110 are wrapped by the isolation layers 116, the spacer layers 106 and the gate dielectric layers 112, the channel layers 110 may remain substantially intact as well. Subsequently, a conductive material is formed on the current structure by a deposition process (e.g., a PVD process, a CVD process or an ALD process), a plating process or a combination thereof. The conductive material is filled in the trenches TR2, and also the spaces that are previously occupied by the sacrificial layers 308. Thereafter, an etching process (e.g., an anisotropic etching process) or a combination of the etching process and a polishing process is performed to remove portions of the conductive material located between the stacking structures 102 and above the stacking structures 102. Remained portions of the conductive material form the word lines 108.

Figure 3M:
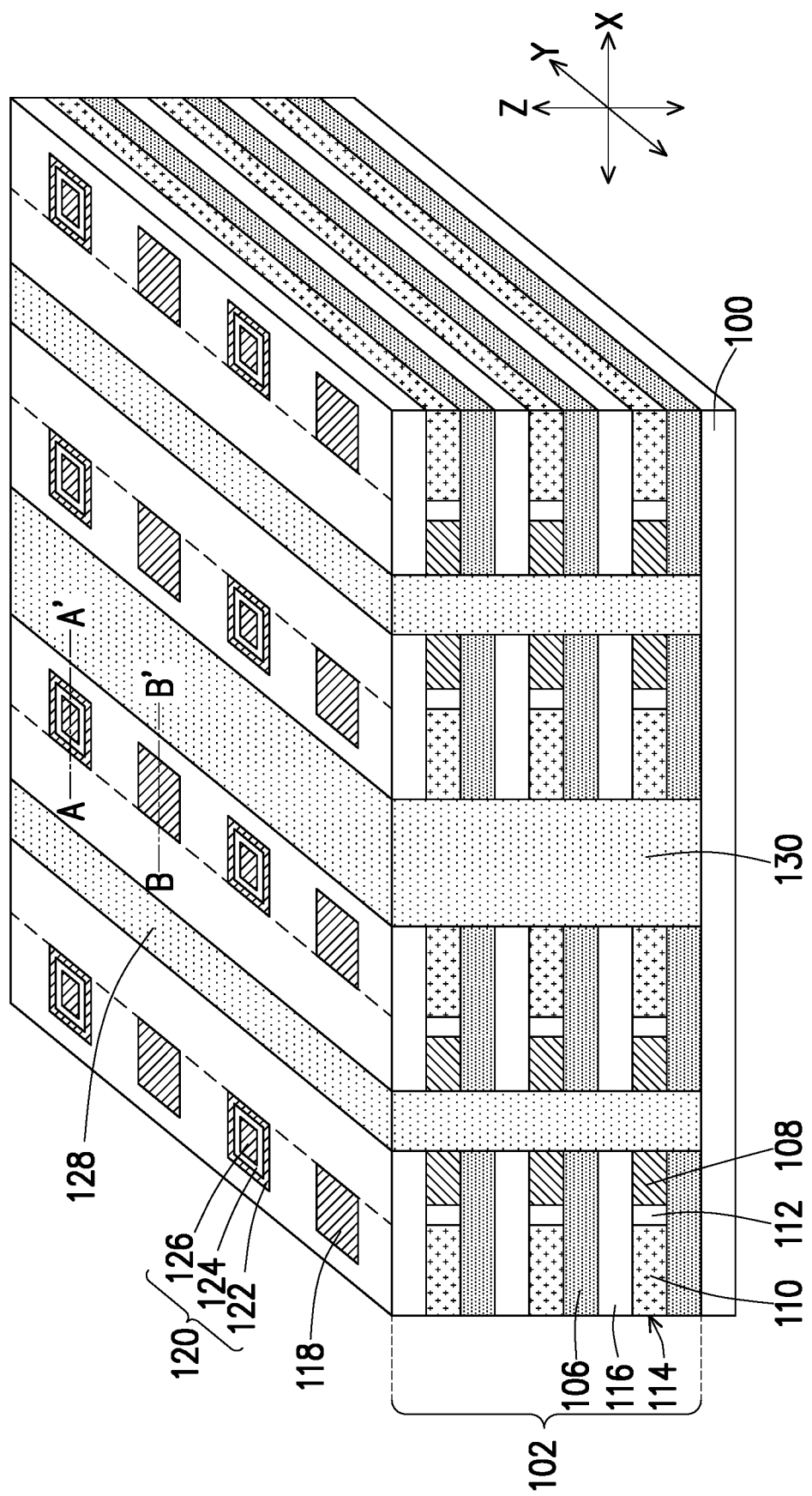

Referring to FIG. 2 and FIG. 3M, step S124 is performed, and the isolation walls 128 are formed in the trenches TR2. In some embodiments, a method for forming the isolation walls 128 includes filling an insulating material into the trenches TR2 by a deposition process, such as a CVD process. Subsequently, portions of the insulating material above the stacking structures 102 may be removed by a polishing process, and remained portions of the insulating material form the isolation walls 128.

Referring to FIG. 2 and FIG. 1A, step S126 is performed, and the isolation pillars 132 are formed. The isolation pillars 132 are formed in through holes penetrating through the stacking structures 102, and dividing each of the channel layers 110 into separated portions. In some embodiments, a method for forming the isolation pillars 132 includes forming the through holes in the stacking structures 102 by a lithography process and an etching process (e.g., an anisotropic etching process). Subsequently, filling an insulating material into the through holes by a deposition process (e.g., a PVD process, a CVD process or an ALD process). Thereafter, portions of the insulating material above the stacking structures 102 may be removed by a polishing process, and remained portions of the insulating material may form the isolation pillars 132.

Up to here, manufacturing of the memory device 10 as shown in FIG. 1A has been completed. Although not shown, the stacking structures 102 may extend to a staircase structure for out-routing the word lines 108 in the stacking structures 102 to a driving circuit. The driving circuit may be formed on a semiconductor substrate lying below the substrate 100, and may be referred as complementary-metal-oxide-semiconductor (CMOS) circuit under array (CUA). In some embodiments, a process for forming the staircase structure includes shaping an edge portion of the initial stacking structure 302 as shown in FIG. 3A before forming the trenches TR1 as shown in FIG. 3B, and is referred as a staircase-first process. In alternative embodiments, a process for forming the staircase structure includes shaping edge portions of the stacking structures 302' as shown in FIG. 3J before the gate replacement process as described with reference to FIG. 3K and FIG. 3L, and such process may be referred as a staircase-last process. For instance, the process for shaping the initial stacking structure 302 or the stacking structure 302' may include multiple etch-and-trim steps. Moreover, the conductive pillars 118 and the inner electrodes 126 of the storage pillars 120 may be further routed to source lines and bit lines (both not shown). Alternatively, the conductive pillars 118 and the inner electrodes 126 may be functioned as source lines and bit lines. In some embodiments, the source lines and the bit lines lie above the memory device 10. In alternative embodiments, the source lines lie over the memory device 10 while the bit lines extend below the substrate 100, or the bit lines lie over the memory device 10 while the source lines extend below the substrate 100. Further, the source lines and the bit lines may be further routed to the underlying driving circuit, along with the word lines 108.

Figure 5A:
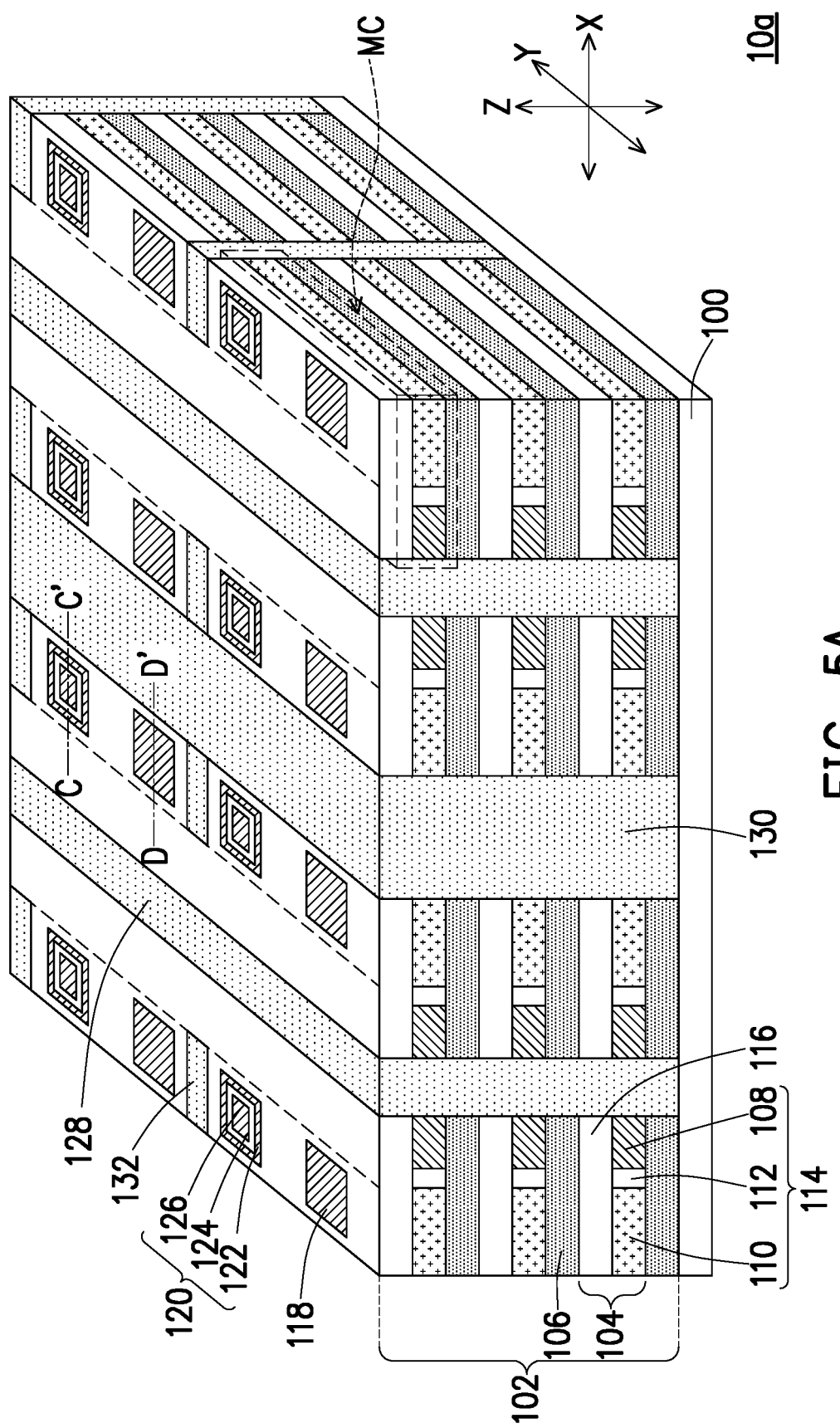
FIG. 5A is a schematic three-dimensional view illustrating a memory device according to some embodiments of the present disclosure.
Figure 5B:
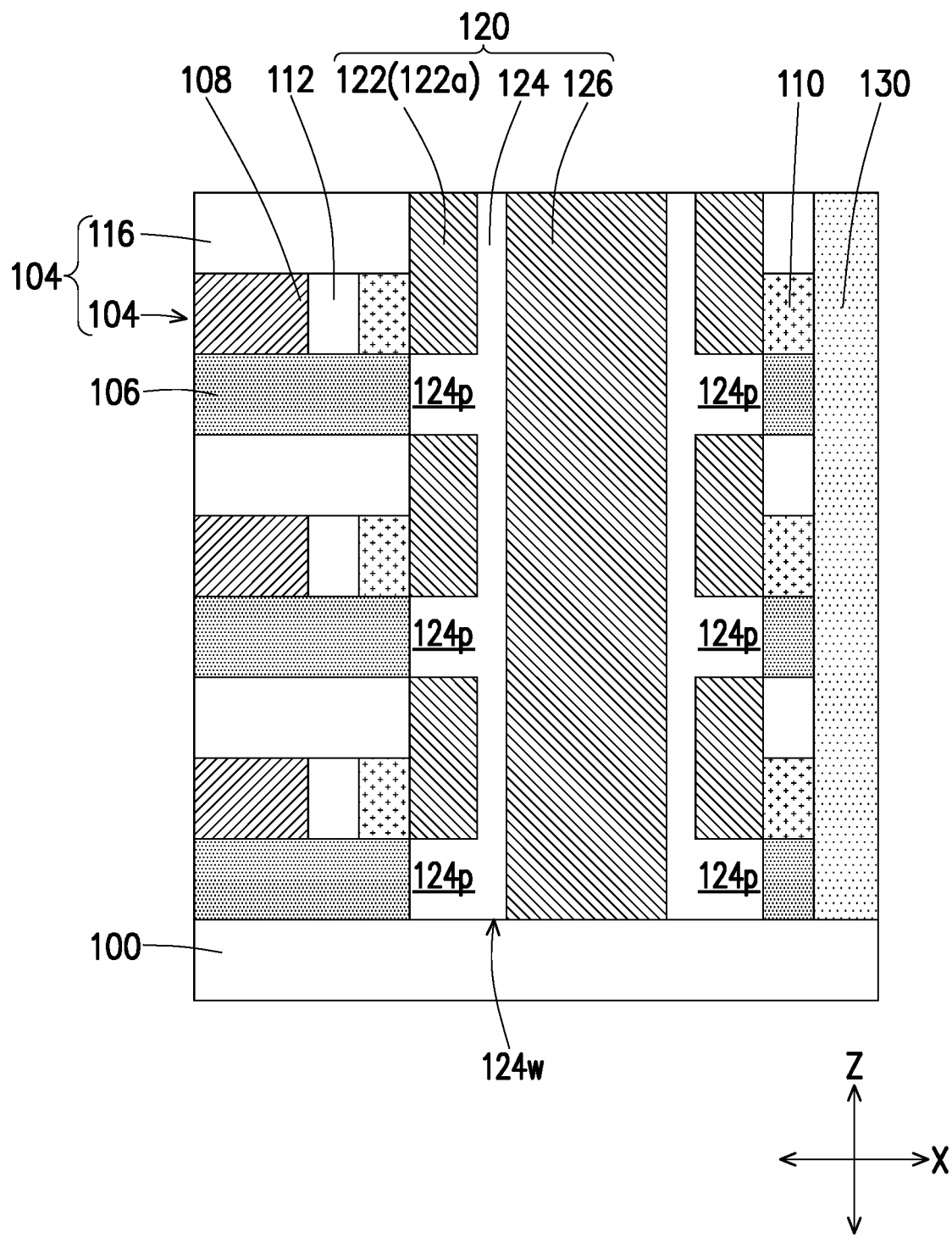
FIG. 5B is a schematic cross-sectional view along line C-C' as shown in FIG. 5A.
Figure 5C:
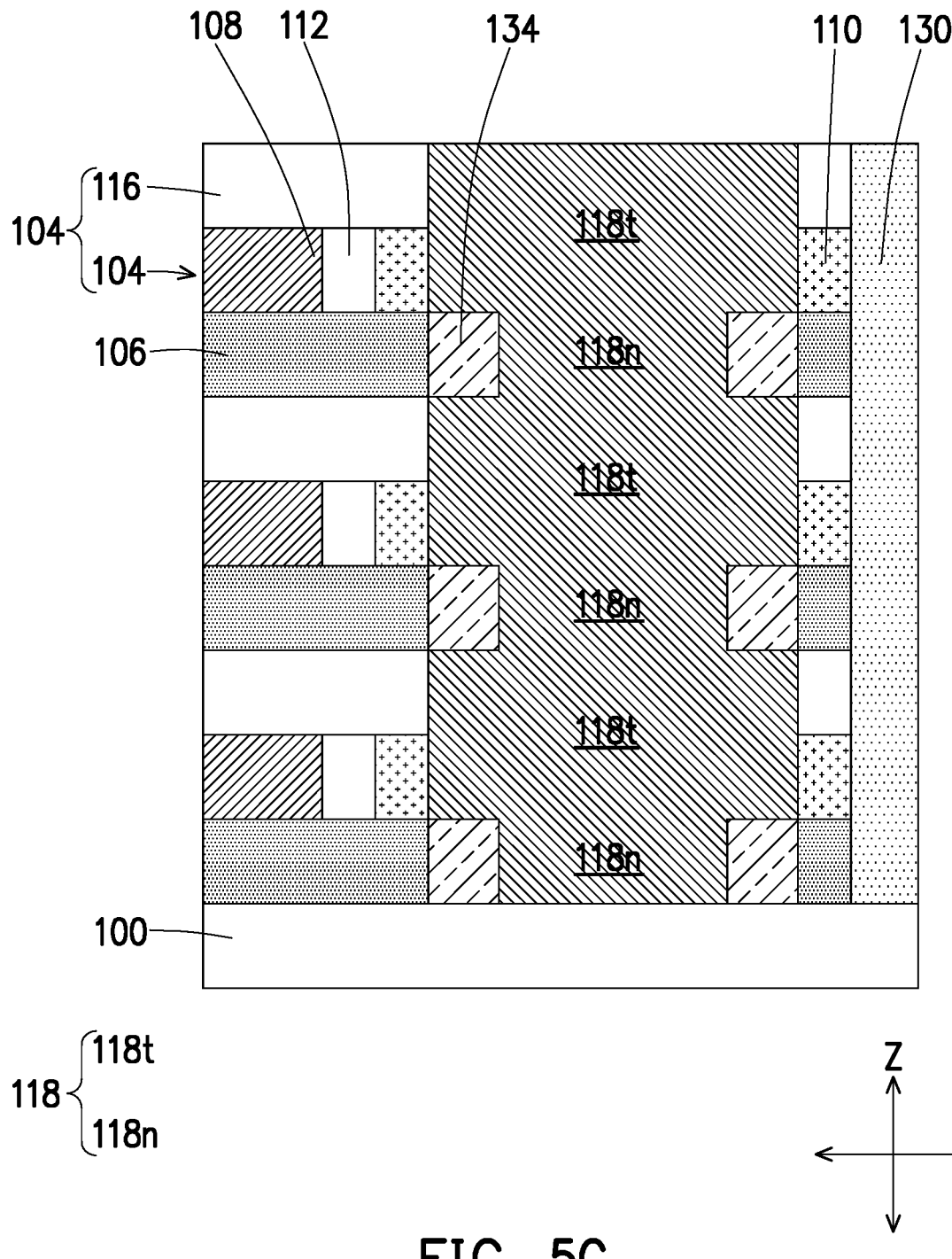
FIG. 5C is a schematic cross-sectional view along line D-D' as shown in FIG. 5A.

FIG. 5A is a schematic three-dimensional view illustrating a memory device 10a according to some embodiments of the present disclosure. FIG. 5B is a schematic cross-sectional view along line C-C' as shown in FIG. 5A. FIG. 5C is a schematic cross-sectional view along line D-D' as shown in FIG. 5A. The memory device 10a as shown in FIG. 5A is similar to the memory device 10 as shown in FIG. 1A. Therefore, only differences between the memory devices 10, 10a will be described, the same or the like parts of the memory devices 10, 10a would not be repeated again.

Referring to FIG. 5A through FIG. 5C, in some embodiments, the conductive pillars 118 and the storage pillars 120 are laterally spaced apart from the gate dielectric layers 112. In these embodiments, as shown in FIG. 5B, the annulus portions 122a of the outer electrodes 122 in the storage pillars 120 are laterally surrounded by the channel layers 110, and in lateral contact with the gate dielectric layers 112 through the channel layers 110. In addition, as shown in FIG. 5C, thick portions 118t of the conductive pillars 118 are laterally surrounded by the channel layers 110 and the isolation layers 116, and in lateral contact with the gate dielectric layers 112 through the channel layers 110.

Figure 6A:
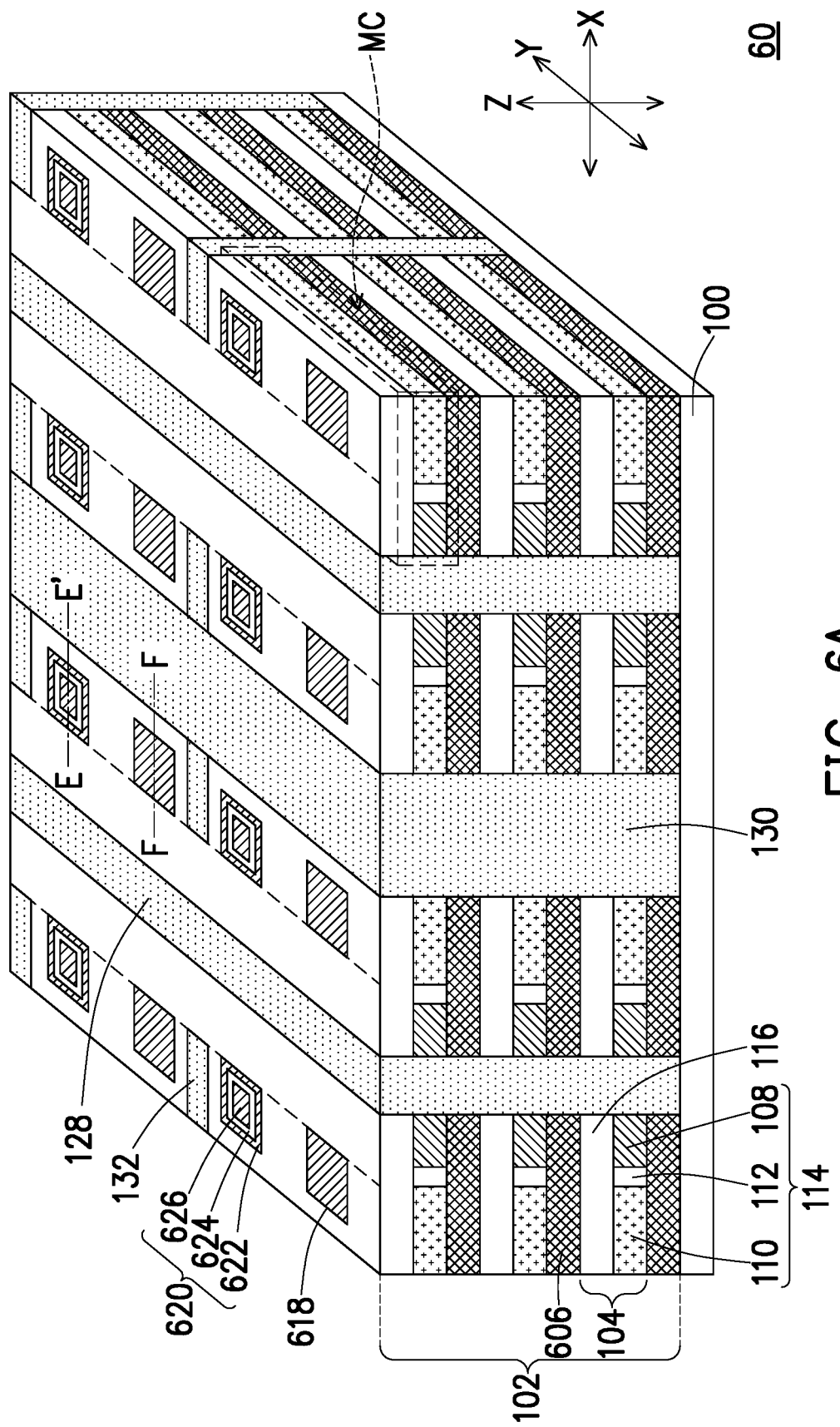
FIG. 6A is a schematic three-dimensional view illustrating a memory device according to some embodiments of the present disclosure.
Figure 6B:
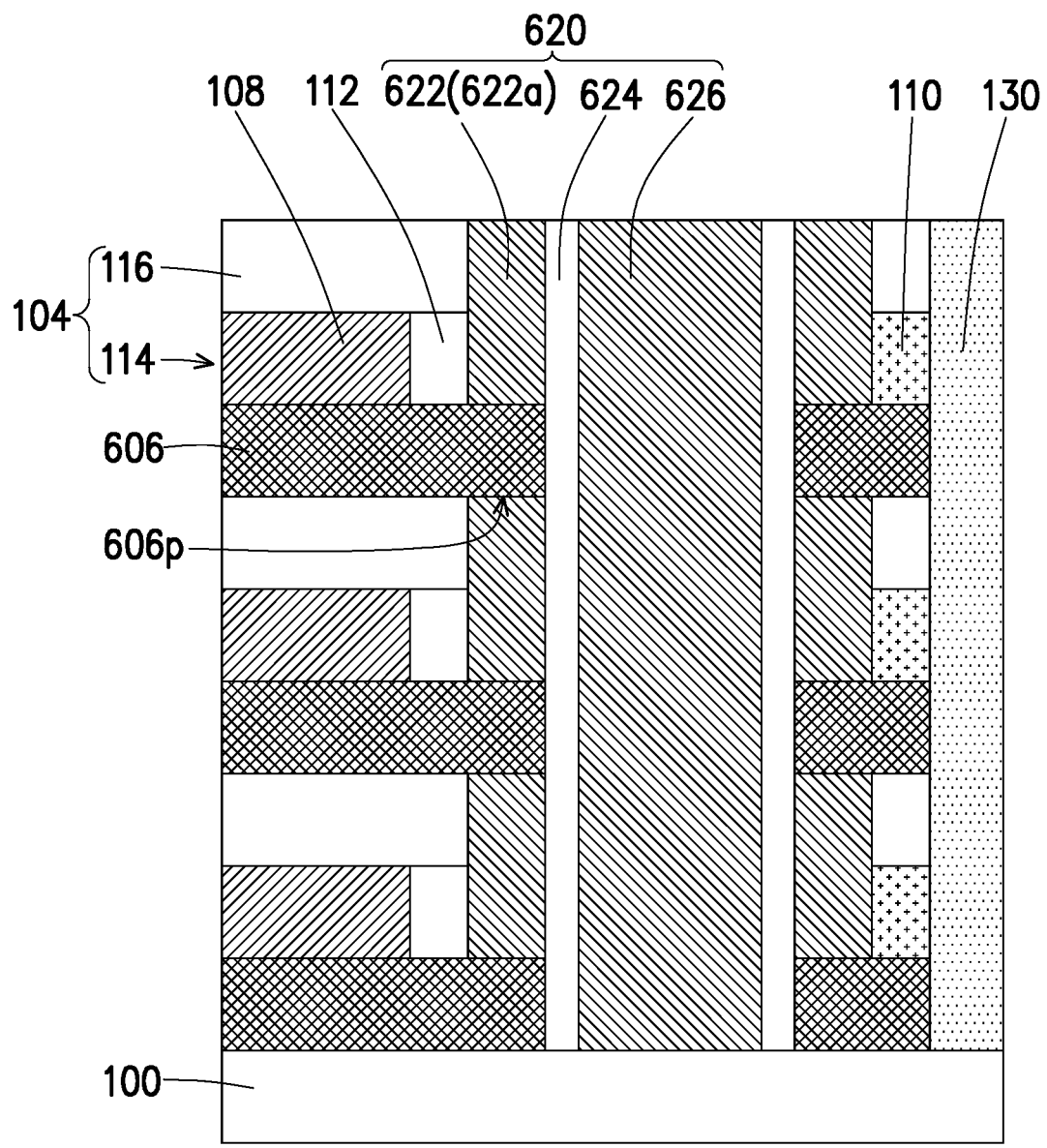
FIG. 6B is a schematic cross-sectional view along line E-E' as shown in FIG. 6A.
Figure 6C:
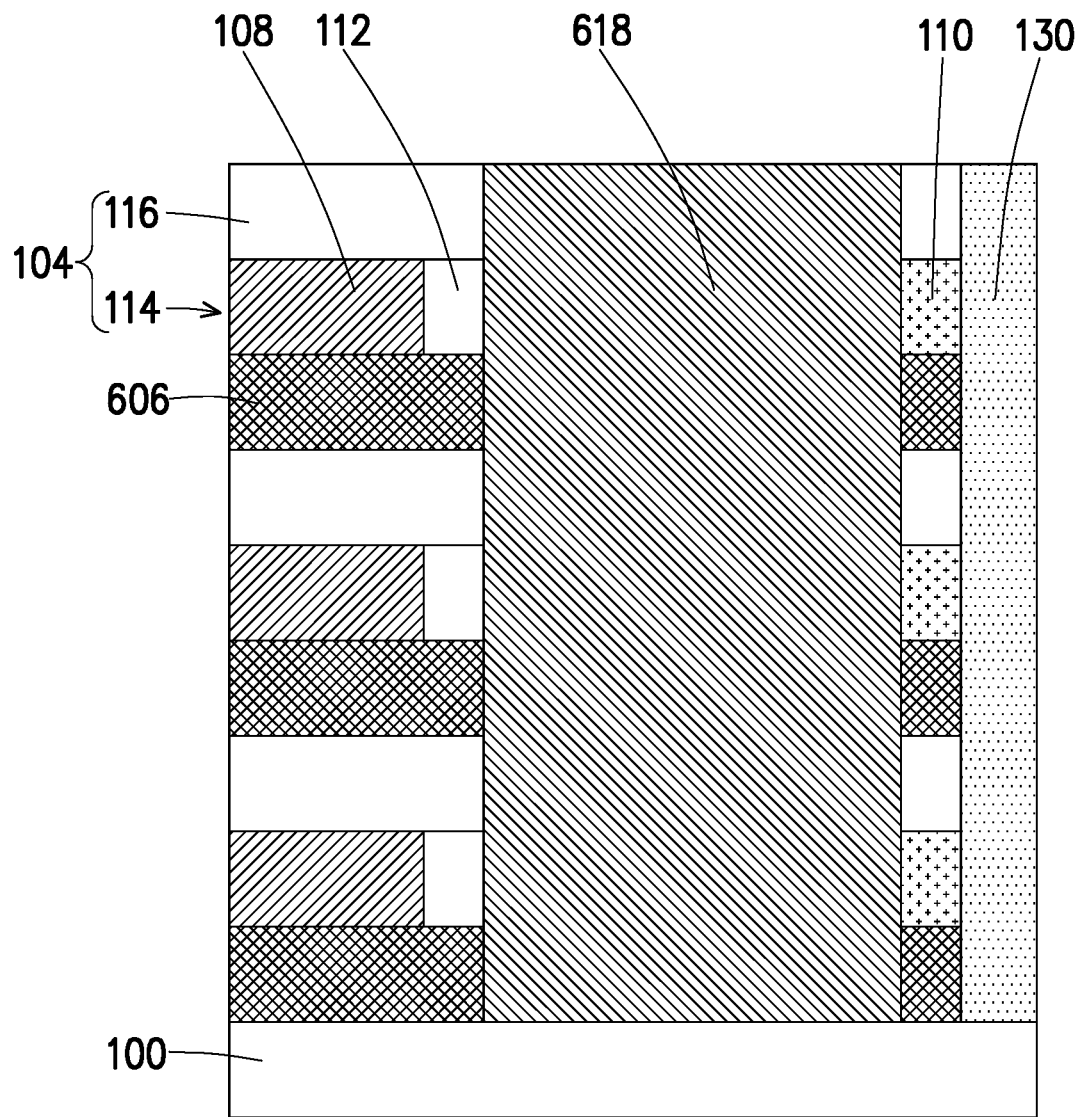
FIG. 6C is a schematic cross-sectional view along line F-F' as shown in FIG. 6A.

FIG. 6A is a schematic three-dimensional view illustrating a memory device 60 according to some embodiments of the present disclosure. FIG. 6B is a schematic cross-sectional view along line E-E' as shown in FIG. 6A. FIG. 6C is a schematic cross-sectional view along line F-F' as shown in FIG. 6A. The memory device 60 as shown in FIG. 6A is similar to the memory device 10 as shown in FIG. 1A. Therefore, only differences between the memory devices 10, 20 will be described, the same or the like parts of the memory devices 10, 20 would not be repeated again.

Referring to FIG. 6A, the film sets 104 in each stacking structure 102 are separated from one another by spacer layers 606. In some embodiments, the bottommost film set 104 in each stacking structure 102 is separated from the substrate 100 via one of the bottommost spacer layers 606. As will be further described, the spacer layers 606 may have sufficient etching selectivity with respect to the channel layers 110, the gate dielectric layers 112 and the isolation layers 116.

Referring to FIG. 6A and FIG. 6B, storage pillars 620 vertically extend through the stacking structures 102. The channel layers 110 are penetrated through by the storage pillars 620, along with the isolation layers 116 and the spacer layers 606. Accordingly, the storage pillars 620 are in lateral contact with the channel layers 110, the isolation layers 116 and the spacer layers 606. In some embodiments, the storage pillars 620 are further in lateral contact with the gate dielectric layers 112. As shown in FIG. 6B, the spacer layers 606 laterally protrude into the storage pillars 620. The storage pillars 620 may respectively include an outer electrode 622, a switching layer 624 and an inner electrode 626. The inner electrode 626 is laterally surrounded by the switching layer 624. The switching layer 624 is in lateral contact with the protruded portions 606*p* of the spacer layers 606, and are laterally spaced apart from the gate dielectric layers 112, the channel layers 110 and the isolation layers 116 by the outer electrode 622. In some embodiments, the switching layer 624 is formed as a wall structure not having protruded portions as similar to the protruded portions 124*p* of the switching layer 124 as described with reference to FIG. 1C. In these embodiments, the wall structure may have a wall thickness substantially constant along the vertical direction. The outer electrode 622 has vertically separated annulus portions 622*a*. Each of the annulus portions 622*a* of the outer electrode 622 laterally surrounds a section of the inner electrode 626, and spans from this section of the inner electrode 626 to one of the isolation layers 116 and one of the channel layers 110. In those embodiments where the storage pillars 620 are in lateral contact with the gate dielectric layers 112, each of the annulus portions 622*a* of the outer electrode 622 is further in lateral contact with one of the gate dielectric layers 112. In addition, the annulus portions 622*a* of the outer electrode 622 are vertically separated from one another by the protruded portions 606*p* of the spacer layers 606. In these embodiments, the protruded portion 606*p* of each spacer layer 606 is sandwiched between vertically adjacent annulus portions 622*a* of the outer electrode 622. Materials for forming the outer electrode 622, the switching layer 624 and the inner electrode 626 are similar to the materials for forming the outer electrode 122, the switching layer 124 and the inner electrode 126 as described with reference to FIG. 1A, thus would not be repeated again.

Referring to FIG. 6A and FIG. 6C, conductive pillars 618 vertically extend through the stacking structures 102. In addition, the conductive pillars 618 are in lateral contact with the spacer layers 606, as well as the channel layers 110 and the isolation layers 116. In some embodiments, the conductive pillars 618 are further in lateral contact with the gate dielectric layers 112. Annulus spacers (e.g., the annulus spacers 134 as described with reference to FIG. 1E) are absent between the conductive pillars 618 and the spacer layers 606. Further, the spacer layers 606 may not protrude into the conductive pillars 618, and the conductive pillars 618 may respectively have a width (e.g., a dimension along the direction X) substantially constant along the vertical direction Z. In addition, sidewalls of the spacer layers 606 in lateral contact with the conductive pillars 618 may be substantially coplanar with sidewalls of the composite layers 114 in lateral contact with the conductive pillars 618 as well as sidewalls of the isolation layers 116 in lateral contact with the conductive pillars 618. A material for forming the conductive pillars 618 may be similar to the material for forming the conductive pillars 118 as described with reference to FIG. 1A, thus would not be repeated again.

Figure 7:
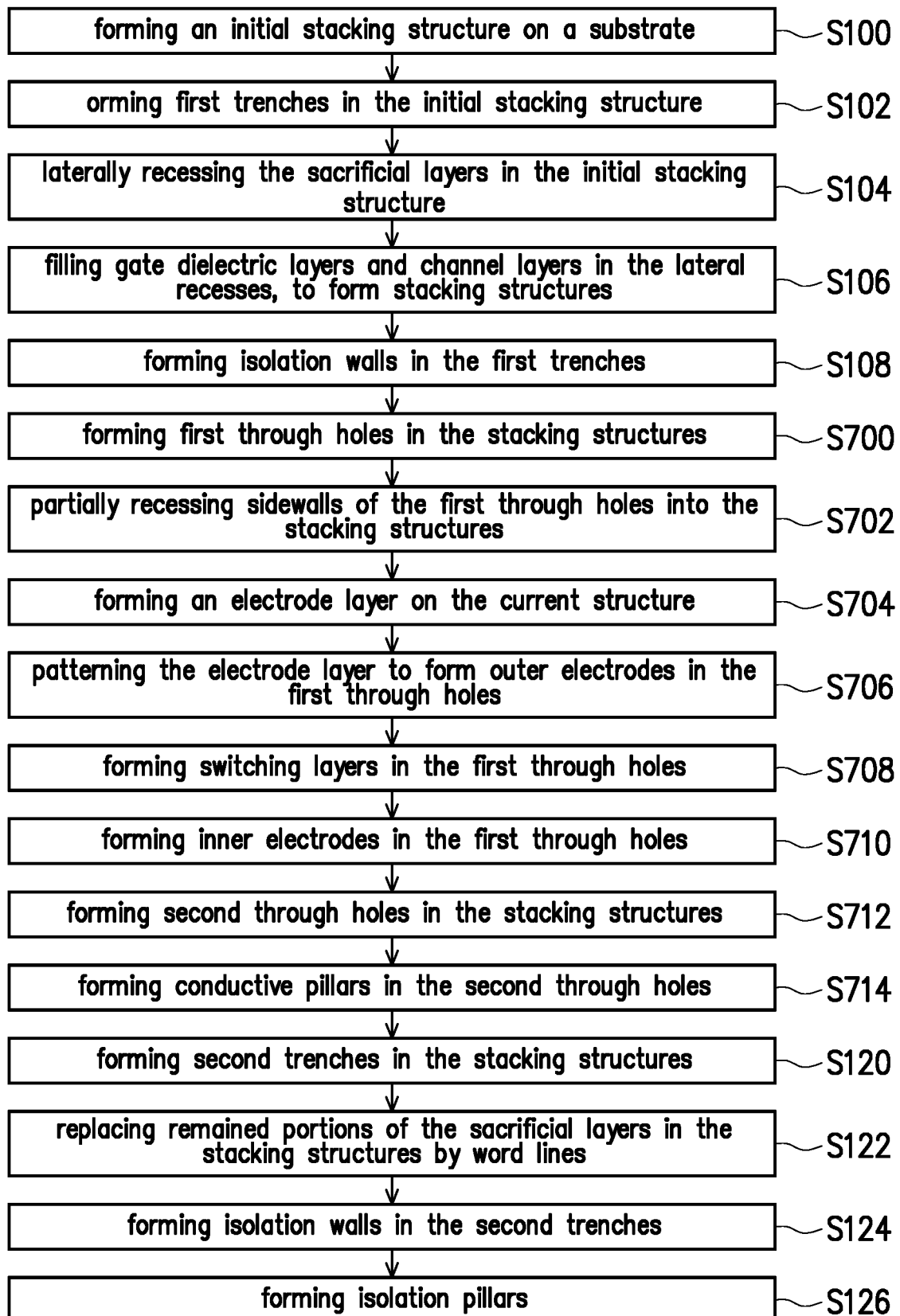
FIG. 7 is a flow diagram illustrating a manufacturing method of the memory device as shown in FIG. 6A.
Figure 8A:
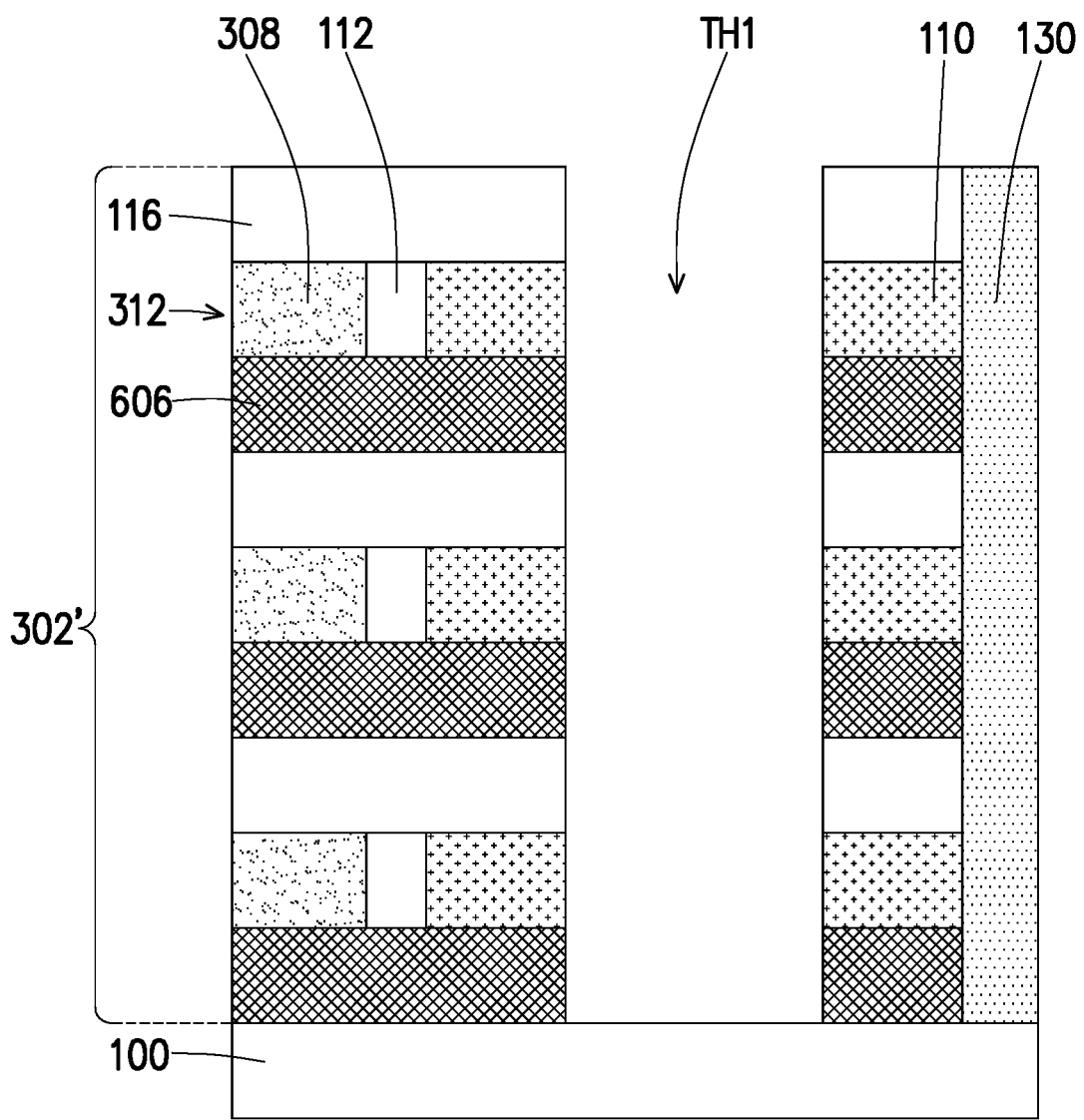
FIG. 8A through FIG. 8E are schematic cross-sectional views illustrating structures at various stages during formation of one of the storage pillars, according to the manufacturing method as shown in FIG. 7.

FIG. 7 is a flow diagram illustrating a manufacturing method of the memory device 60 as shown in FIG. 6A. FIG. 8A through FIG. 8E are schematic cross-sectional views illustrating structures at various stages during formation of one of the storage pillars 620, according to the manufacturing method as shown in FIG. 7. FIG. 8F is a schematic cross-sectional view illustrating an intermediate structure at a stage during formation of one of the conductive pillars 618, according to the manufacturing method as shown in FIG. 7.

Referring to FIG. 7, the manufacturing method begins with performing the steps S100, S102, S104, S106 and S108 as described with reference to FIG. 3A through FIG. 3E, wherein the spacer layers 306 are replaced by the spacer layers 606. Thereafter, as shown in FIG. 8A, step S700 is performed, and through holes TH1 are formed in the stacking structures 302'. The through holes TH1 are configured to accommodate the storage pillars 620 to be formed in the following steps. The through holes TH1 may penetrate through the channel layers 110, as well as the isolation layers 116 and the spacer layers 606. Surfaces of the channel layers 110, the isolation layers 116 and the spacer layers 606 exposed at a sidewall of each through hole TH1 may be substantially coplanar with one another. In other words, the through holes TH1 may respectively have a substantially straight sidewall. In some embodiments, the through holes TH1 may be currently in lateral contact with the gate dielectric layers 112 through portions of the channel layers 110. In these embodiments, the gate dielectric layers 112 may not expose at the sidewalls of the through holes TH1 in the current step. A method for forming the through holes TH1 may include a lithography process and an etching process, such as an anisotropic etching process.

Figure 8B:
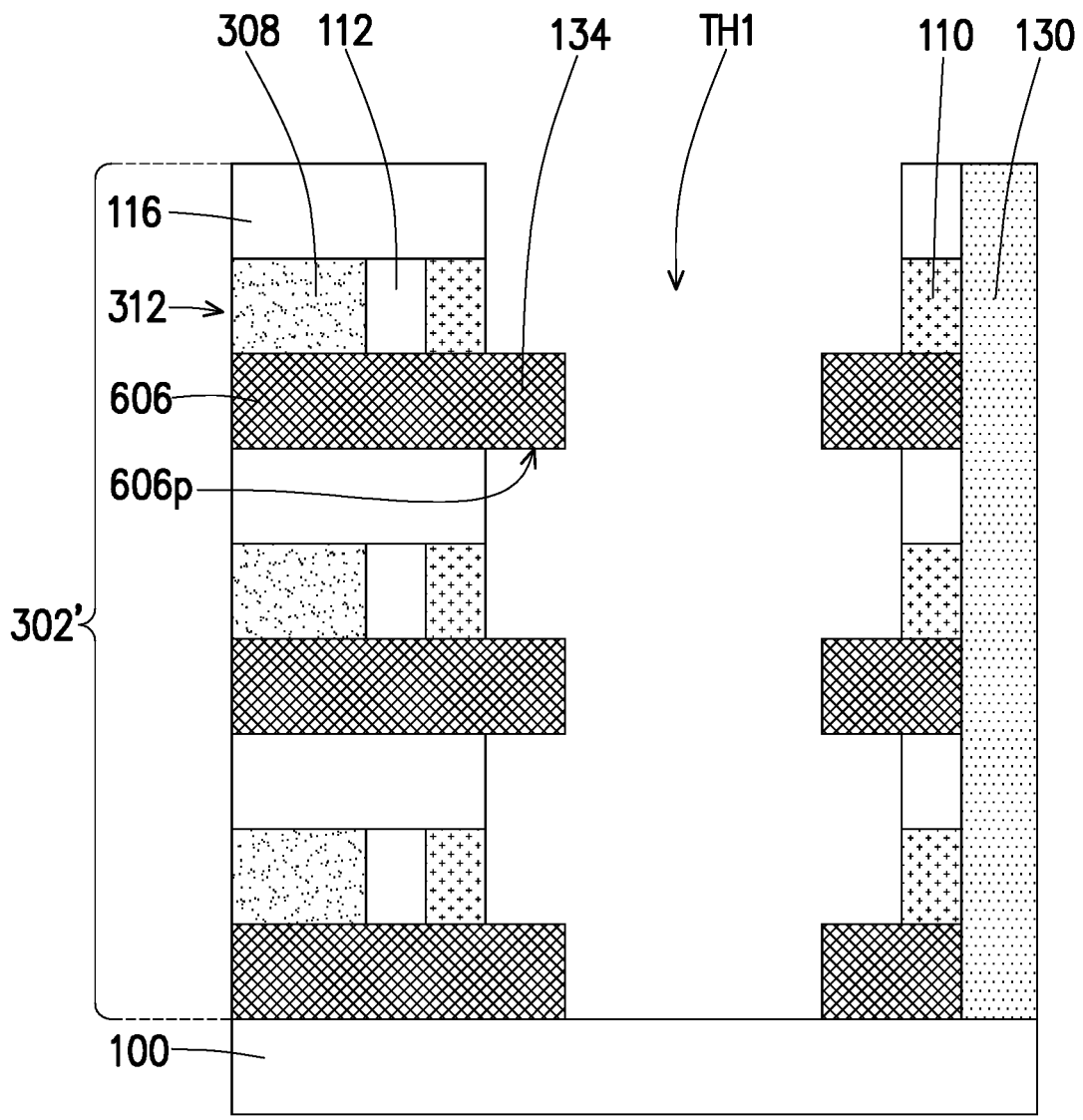

Referring to FIG. 7 and FIG. 8B, step S702 is performed, and the sidewalls of the through holes TH1 are partially recessed into the stacking structures 302'. The channel layers 110 and the isolation layers 116 are laterally recessed, with respect to the spacer layers 606. Consequently, the spacer layers 606 can be regarded as having the protruded portions 606*p* extending into the through holes TH1. In some embodiments, the gate dielectric layers 112 are currently exposed at the sidewalls of the through holes TH1. A method for partially recessing the sidewalls of the through holes TH1 may include an etching process, such as an isotropic etching process. Since the spacer layers 606 have sufficient etching selectivity with respect to the channel layers 110 and the isolation layers 116, the spacer layers 606 may remain substantially intact during the etching process, while the channel layers 110 and the isolation layers 116 are laterally recessed.

Figure 8C:
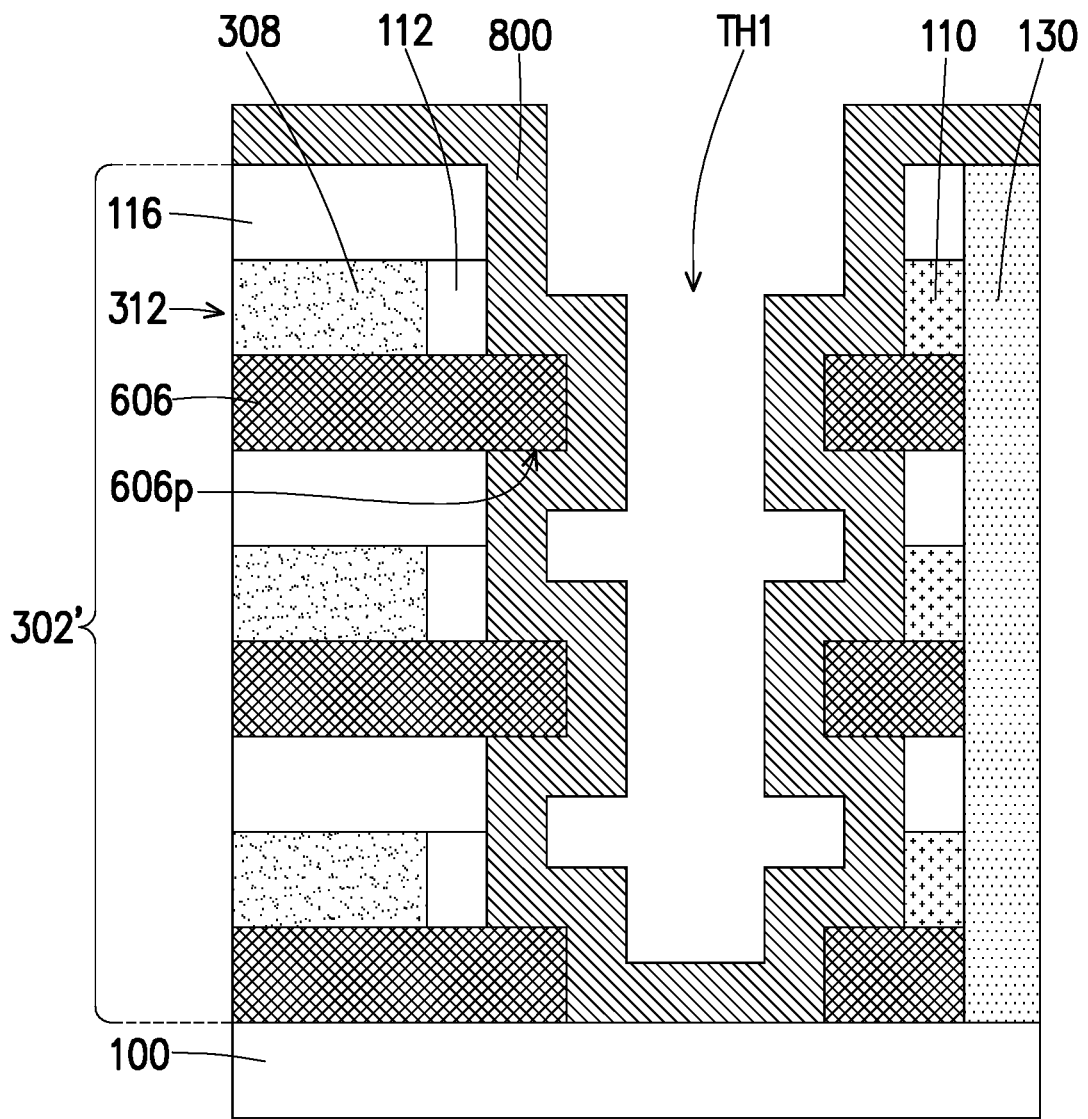

Referring to FIG. 7 and FIG. 8C, step S704 is performed, and an electrode layer 800 is formed on the current structure. The electrode layer 800 may conformally cover the sidewalls and bottom surfaces of the through holes TH1, and may extend onto the stacking structures 302'. Accordingly, the electrode layer 800 may be laterally protruded into the through holes TH1, in correspondence with the protruded portions 606*p* of the spacer layers 606. The electrode layer 800 will be patterned to form the outer electrodes 622 in the following step. In some embodiments, a method for forming the electrode layer 800 includes a deposition process (e.g., a PVD process, a CVD process or an ALD process), a plating process or a combination thereof.

Figure 8D:
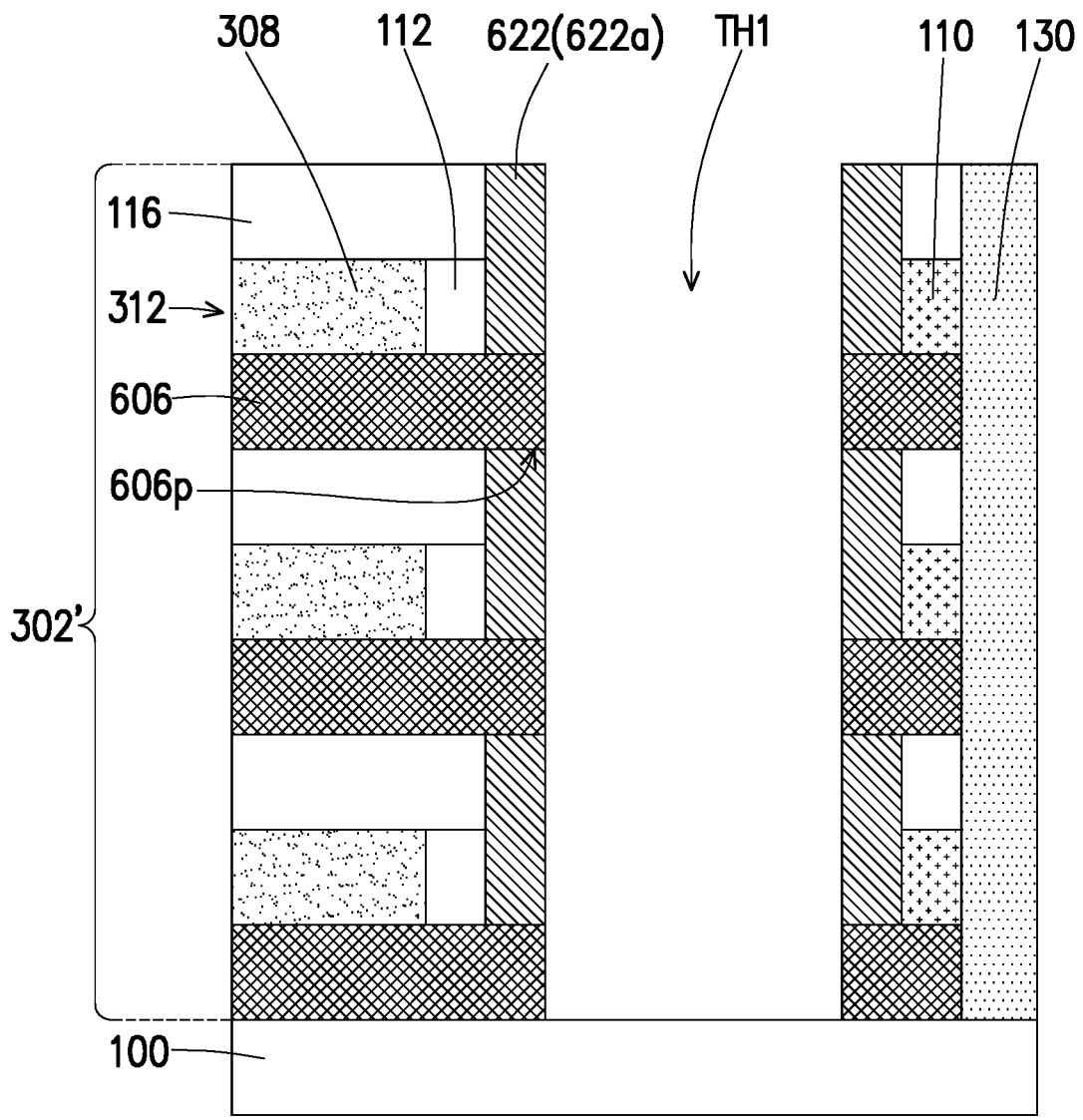

Referring to FIG. 7 and FIG. 8D, step S706 is performed, and the electrode layer 800 is patterned to form the outer electrodes 622. During the patterning process, portions of the electrode layer 800 laterally protruded in correspondence with the protruded portions 606*p* of the spacer layers 606 are removed. In addition, portions of the electrode layer 800 lying on the bottom surfaces of the through holes TH1 as well as portions of the electrode layer 800 lying above the stacking structures 302' are also removed. The remained portions of the electrode layer 800 form the annulus portions 622a of the outer electrodes 622. In some embodiments, a method for patterning the electrode layer 800 to form the outer electrodes 622 includes an etching process, such as an anisotropic etching process.

Figure 8E:
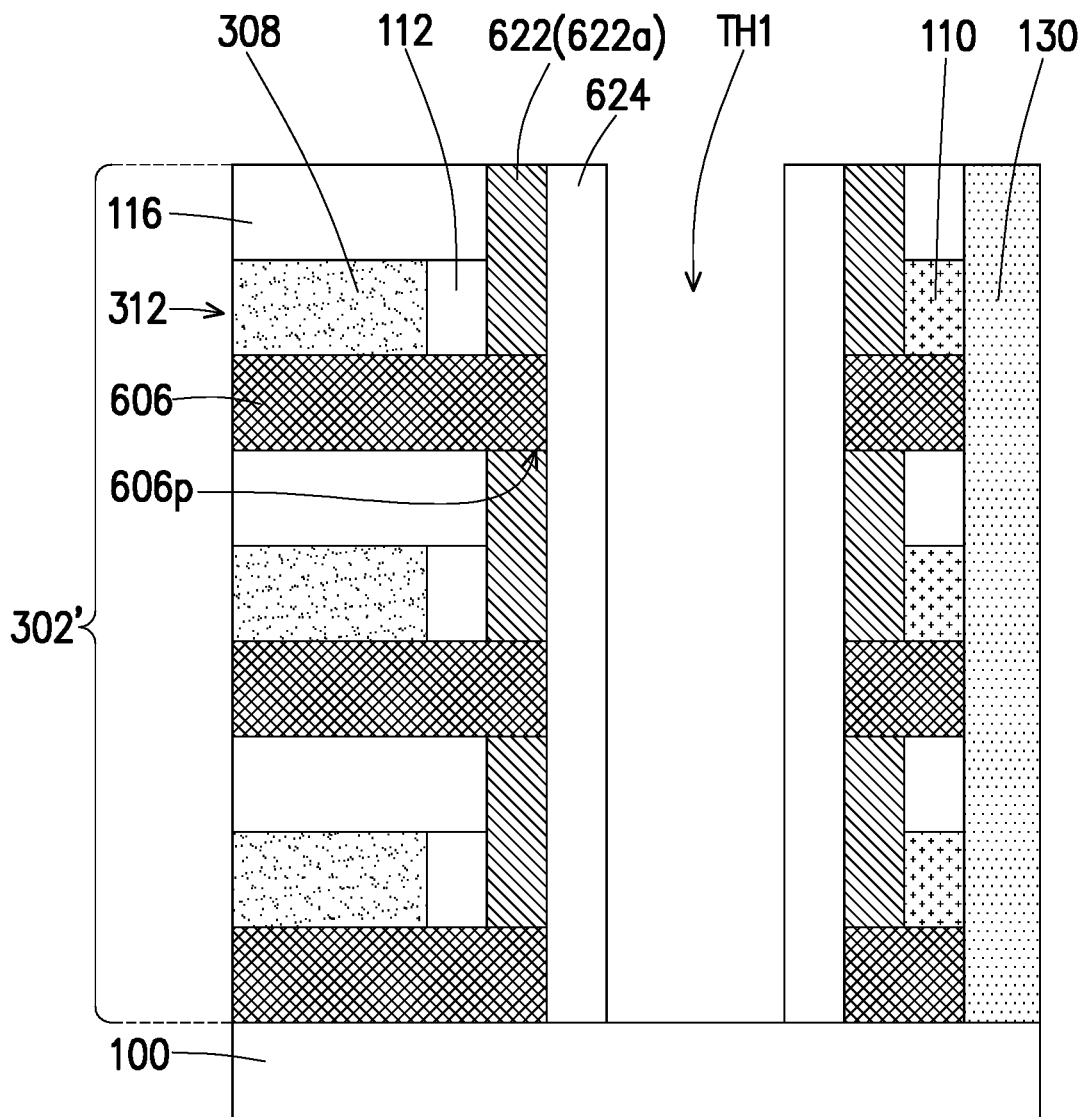
Figure 8F:
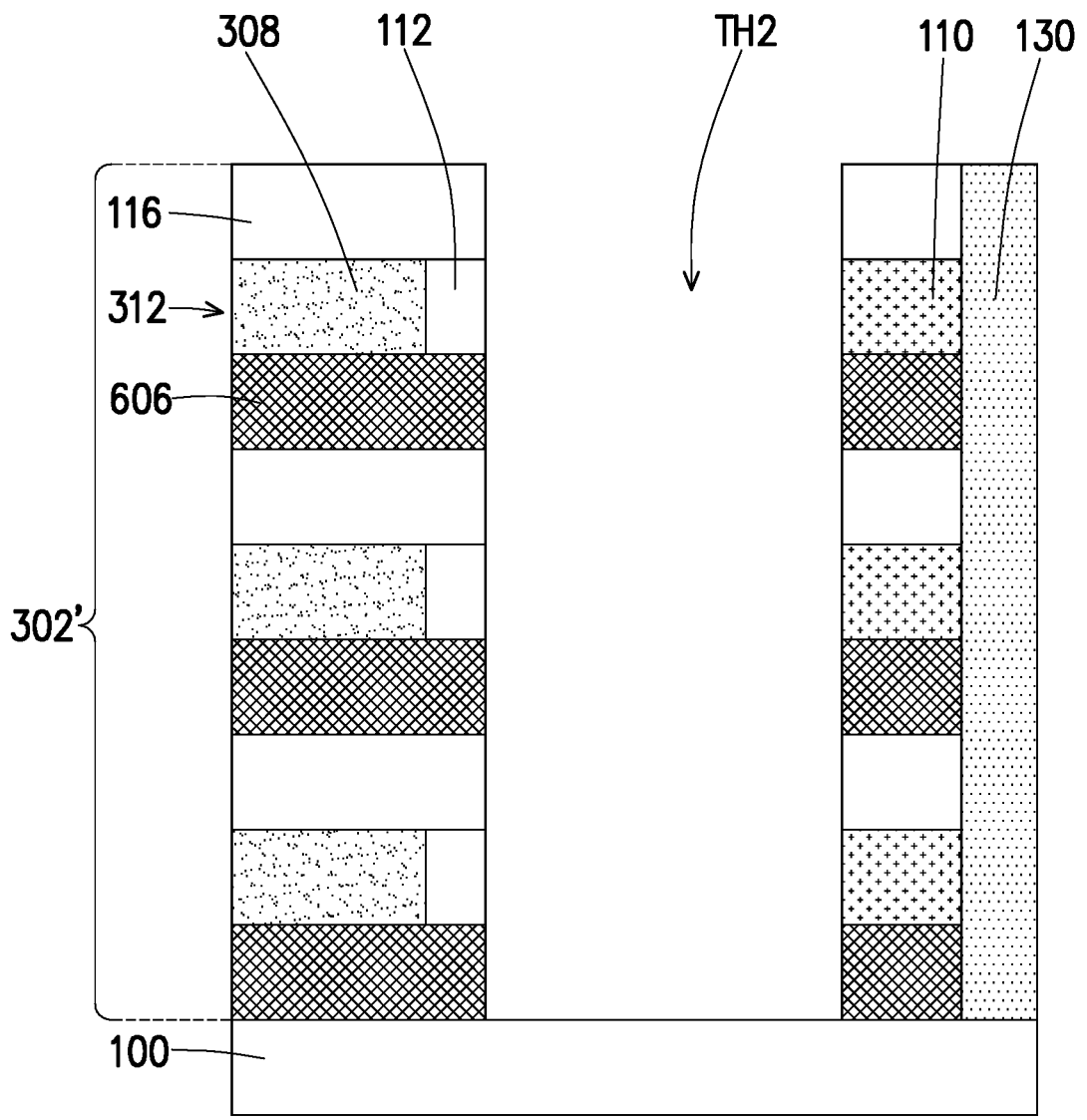
FIG. 8F is a schematic cross-sectional view illustrating an intermediate structure at a stage during formation of one of the conductive pillars, according to the manufacturing method as shown in FIG. 7.

Referring to FIG. 7 and FIG. 8E, step S708 is performed, and the switching layers 624 are formed in the through holes TH1. The switching layers 624 cover exposed inner sidewalls of the outer electrodes 122, and are in lateral contact with the spacer layers 606. In some embodiments, a method for forming the switching layers 624 includes forming a switching material layer conformally covering the structure as shown in FIG. 7D by a deposition process, such as an ALD process or a CVD process. Subsequently, portions of the switching material layer lying on the bottom surfaces of the through holes TH1 and above the stacking structures 302' are removed by an etching process, such as an anisotropic etching process. Remained portions of the switching material layer form the switching layers 624.

Referring to FIG. 7 and FIG. 6B, step S710 is performed, and the inner electrodes 626 are formed. The inner electrodes 626 fill up the through holes TH1. In some embodiments, a method for forming the inner electrodes 626 includes filling a conductive material into the through holes TH1 by a deposition process (e.g., a PVD process, a CVD process or an ALD process), a plating process or a combination thereof. Subsequently, a polishing process, an etching process or a combination thereof is performed for removing portions of the conductive material above the stacking structures 302'. Remained portions of the conductive material are located in the through holes TH1, and form the inner electrodes 626.

Referring to FIG. 7 and FIG. 8F, step S712 is performed, and through holes TH2 are formed in the stacking structures 302'. The through holes TH2 are configured to accommodate the conductive pillars 618 to be formed in the following step. The through holes TH2 may penetrate through the channel layers 110, as well as the isolation layers 116 and the spacer layers 606. In some embodiments, the gate dielectric layers 112 are exposed at sidewalls of the through holes TH2, such that the conductive pillars 618 to be formed will be in lateral contact with the gate dielectric layers 112. In addition, in some embodiments, the through holes TH2 may respectively have a straight sidewall. A method for forming the through holes TH2 may include a lithography process and an etching process, such as an anisotropic etching process.

Referring to FIG. 7 and FIG. 6C, step S714 is performed, and the conductive pillars 618 are formed. The conductive pillars 618 fill up the through holes TH2. In some embodiments, a method for forming the conductive pillars 618 includes filling a conductive material into the through holes TH2 by a deposition process (e.g., a PVD process, a CVD process or an ALD process), a plating process or a combination thereof. Subsequently, a polishing process, an etching process or a combination thereof is performed for removing portions of the conductive material above the stacking structures 302'. Remained portions of the conductive material are located in the through holes TH2, and form the conductive pillars 618.

In embodiments described above, the conductive pillars 618 are formed after formation of the storage pillars 620. However, in alternative embodiments, the conductive pillars 618 are formed before formation of the storage pillars 620. In these embodiments, steps S712, S714 are performed before steps S700, S702, S704, S706, S708, S710. Further, the steps S120, S122, S124, S126 as described with reference to FIG. 3K, FIG. 3L, FIG. 3M and FIG. 1A may be subsequently performed to complete the manufacturing of the memory device 60 as shown in FIG. 6A.

Figure 9:
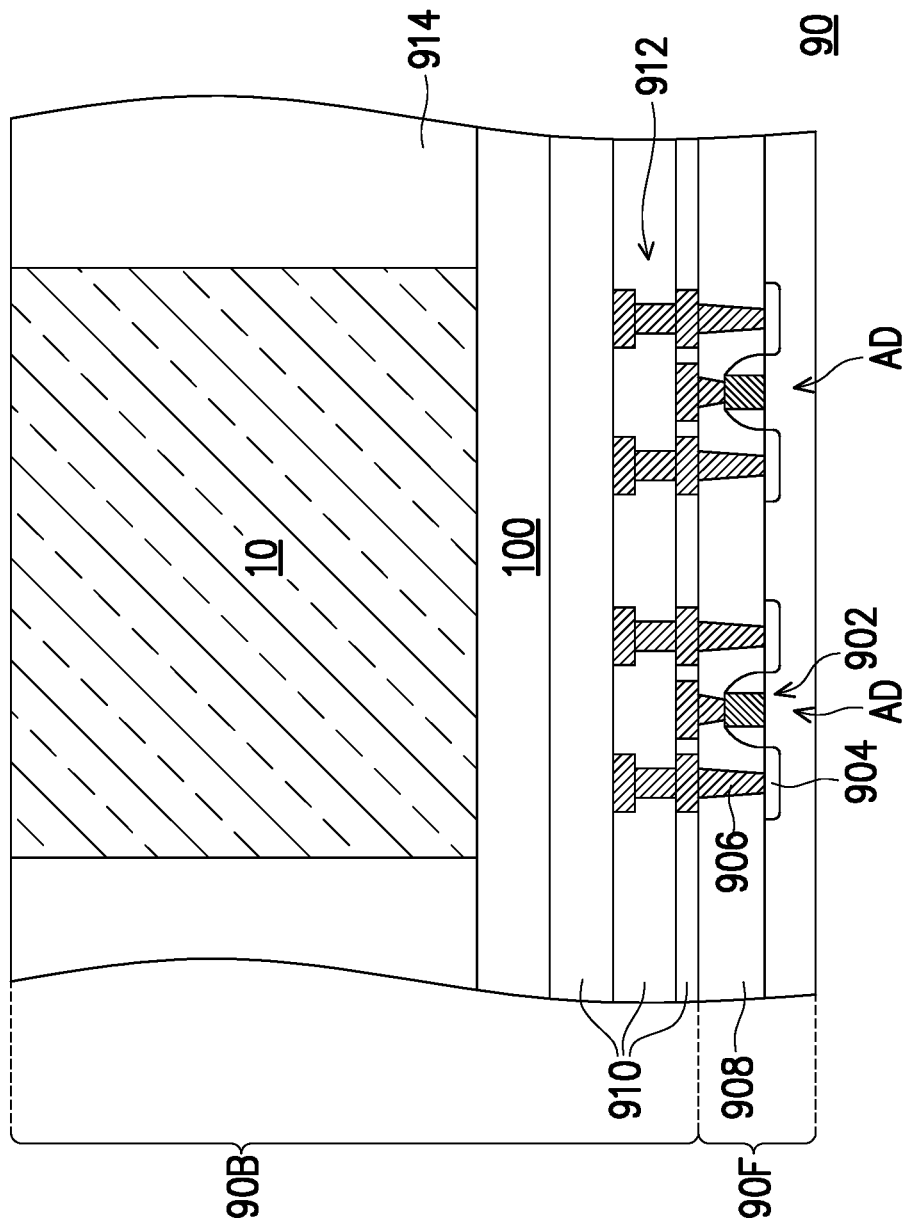
FIG. 9 is a cross-sectional view illustrating a portion of a semiconductor device according to some embodiments of the present disclosure.

FIG. 9 is a cross-sectional view illustrating a portion of a semiconductor device 90 according to some embodiments of the present disclosure.

Referring to FIG. 1A and FIG. 9, in some embodiments, the memory device 90 as described with reference to FIG. 1A is embedded in a back-end-of-line (BEOL) structure 90B of the semiconductor device 90 shown in FIG. 9. The BEOL structure 90B is formed on a front-end-of-line (FEOL) structure 90F, and includes conductive elements electrically connected to active devices in the FEOL structure 90F. In some embodiments, the FEOL structure 90F is formed on a surface region of a semiconductor substrate 900. For instance, the semiconductor substrate 900 may be a semiconductor wafer or a a SOI wafer. The FEOL structure 90F may include active devices AD. For conciseness, only two of the active devices AD are depicted. The active devices AD, such as transistors, may respectively include a gate structure 902 and source/drain structures 904 at opposite sides of the gate structure 902. In some embodiments, the gate structure 902 is disposed on a substantially flat surface of the semiconductor substrate 900, and the source/drain structures 904 at opposite sides of the gate structure 902 are formed in shallow regions of the semiconductor substrate 900. In these embodiments, the active device AD may be referred as a planar-type field effect transistor (FET), and a skin portion of the semiconductor substrate 900 covered by the gate structure 902 and extending between the source/drain structures 904 is functioned as a conductive channel of the FET. In alternative embodiments, the active device AD is formed as a fin-type FET (or referred as finFET) or a gate-all-around (GAA) FET. In these alternative embodiments, three-dimensional structures intersected with and covered by a gate structure are functioned as conductive channels of these FETs. Further, the FEOL structure 80F may include contact plugs 906 standing on the gate structures 902 and the source/drain structures 904, as well as a dielectric layer 908 laterally surrounding the gate structure 902 and the contact plugs 906.

The BEOL structure 90B may include a stack of dielectric layers 910, and include conductive elements 912 formed in the stack of dielectric layers 910. The conductive elements 912 are electrically connected to the active devices AD in the FEOL structure 90F, and may include conductive traces and conductive vias. The conductive traces respectively extend on one of the dielectric layers 910, whereas the conductive vias respectively penetrate through one or more of the dielectric layers 910, and establish electrical contact with one or more of the conductive traces. The memory device 10 on the substrate 100 may be disposed on the stack of the dielectric layers 910, and terminals of the memory cells MC in the memory device 10 are routed to the underlying conductive elements 912 through conductive vias (not shown) penetrating through the substrate 100. Accordingly, the memory device 10 can be routed to the active devices AD, and can be driven by these active devices AD. In some embodiments, the memory device 10 may be laterally surrounded by at least one dielectric layer 914. Further, the memory device 10 shown in FIG. 9 may be replaced by the memory device 10a as shown in FIG. 4A or the memory device 60 as shown in FIG. 6A.

As described above, the memory cells in the memory device are stackable, thus the memory device is no longer limited by two-dimensional design, and a storage density of the memory device can be significantly increased. Further, the memory cell is a 1T1R or 1T1C memory cell that uses the three-terminal access transistor. As compared to a two-terminal selector (e.g., an ovonic threshold switching (OTS) selector) that does not have a gate terminal, the three-terminal access transistor according to embodiments of the present disclosure has a gate terminal, and the gate terminal can be used to suppress leakage current. Accordingly, increasing threshold voltage of the access transistor for addressing the leakage issue is not necessary, thus unnecessary increase of operation voltage of the memory device can be prevented. Moreover, the access transistor and the storage element in each memory cell share a common node, and the common nodes of the memory cells in the same stack can be electrically isolated from one another. Consequently, interference between vertically adjacent memory cells can be prevented.

In an aspect of the present disclosure, a memory device is provided. The memory device comprises: word lines, extending along a first direction over a substrate, and vertically spaced apart from one another; channel layers, respectively lining along a sidewall of one of the word lines, and adjacent to the word lines along a second direction intersected with the first direction; gate dielectric layers, respectively lining between one of the word lines and one of the channel layers; a conductive pillar, penetrating through the channel layers; and a storage pillar, penetrating through the channel layers, and laterally spaced apart from the conductive pillar along the first direction, wherein the storage pillar comprises: an inner electrode, continuously extending along a vertical direction; a switching layer, wrapping around the inner electrode; and an outer electrode, laterally surrounding the switching layer, and comprising annulus portions vertically spaced apart from one another and each in lateral contact with a corresponding one of the channel layers.

In another aspect of the present disclosure, a memory device is provided. The memory device comprises: a stacking structure, comprising film sets and spacer layers alternately stacked on a substrate, wherein each of the film sets comprises a composite layer and an isolation layer lying above or below the composite layer, and the composite layers respectively comprise a word line, a channel layer laterally adjacent to the word line, and a gate dielectric layer lining between the word line and the channel layer; a conductive pillar, penetrating through the stacking structure along a vertical direction, wherein the channel layers in the stacking structure are penetrated through by the conductive pillar; and a storage pillar, penetrating through the stacking structure along the vertical direction, and laterally spaced apart from the conductive pillar, wherein the channel layers in the stacking structure are penetrated through by the storage pillar, the storage pillar comprises an inner electrode, a switching layer laterally surrounding the inner electrode, and an outer electrode laterally surrounding the switching layer, and the outer electrode has annulus portions vertically separated from one another and each in contact with a corresponding one of the channel layers.

In yet another aspect of the present disclosure, a memory device is provided. The memory device comprises: a stacking structure, comprising film sets and spacer layers alternately stacked on a substrate, wherein each of the film sets comprises a composite layer and an isolation layer lying above or below the composite layer, and the composite layers respectively comprise a word line, a channel layer laterally adjacent to the word line, and a gate dielectric layer lining between the word line and the channel layer; and a conductive pillar and a storage pillar, separately penetrating through the stacking structure along a vertical direction, wherein the channel layers in the stacking structure are penetrated through by the conductive pillar and the storage pillar, and the storage pillar comprises: an inner electrode, continuously extending along the vertical direction; a switching layer, wrapping around the inner electrode; and an outer electrode, laterally surrounding the switching layer, wherein the spacer layers laterally protrude into the storage pillar with respect to the isolation layers and the channel layers, and the outer electrode of the storage pillar has annulus portions vertically separated from one another by protruded portions of the spacer layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   word lines, extending along a first direction over a substrate, and vertically spaced apart from one another;
   channel layers, respectively lining along a sidewall of one of the word lines, and adjacent to the word lines along a second direction intersected with the first direction;
   gate dielectric layers, respectively lining between one of the word lines and one of the channel layers;
   a conductive pillar, penetrating through the channel layers; and
   a storage pillar, penetrating through the channel layers, and laterally spaced apart from the conductive pillar along the first direction, wherein the storage pillar comprises:
   an inner electrode, continuously extending along a vertical direction;
   a switching layer, wrapping around the inner electrode; and
   an outer electrode, laterally surrounding the switching layer, and comprising annulus portions vertically spaced apart from one another and each in lateral contact with a corresponding one of the channel layers.

2. The memory device according to claim 1, wherein the switching layer has protruded portions respectively filled in a space between vertically adjacent annulus portions of the outer electrode.

3. The memory device according to claim 2, wherein the conductive pillar has thick portions and narrow portions alternately arranged along the vertical direction.

4. The memory device according to claim 3, further comprising:
   annulus spacers, laterally surrounding the narrow portions of the conductive pillar, wherein outer sidewalls of the annulus spacers are substantially coplanar with sidewalls of the thick portions of the conductive pillar.

5. The memory device according to claim 1, wherein the switching layer is formed of a resistance variable material.

6. The memory device according to claim 1, wherein the switching layer is formed of a phase change material.

7. The memory device according to claim 1, wherein the switching layer is formed of a ferroelectric material.

8. The memory device according to claim 1, wherein the conductive pillar and the outer electrode of the storage pillar are in lateral contact with the gate dielectric layers.

9. The memory device according to claim 1, wherein the conductive pillar and the outer electrode of the storage pillar are laterally spaced apart from the gate dielectric layers by portions of the channel layers.

10. A memory device, comprising:
a stacking structure, comprising film sets and spacer layers alternately stacked on a substrate, wherein each of the film sets comprises a composite layer and an isolation layer lying above or below the composite layer, and the composite layers respectively comprise a word line, a channel layer laterally adjacent to the word line, and a gate dielectric layer lining between the word line and the channel layer;
a conductive pillar, penetrating through the stacking structure along a vertical direction, wherein the channel layers in the stacking structure are penetrated through by the conductive pillar; and
a storage pillar, penetrating through the stacking structure along the vertical direction, and laterally spaced apart from the conductive pillar, wherein the channel layers in the stacking structure are penetrated through by the storage pillar, the storage pillar comprises an inner electrode, a switching layer laterally surrounding the inner electrode, and an outer electrode laterally surrounding the switching layer, and the outer electrode has annulus portions vertically separated from one another and each in contact with a corresponding one of the channel layers.

11. The memory device according to claim 10, wherein sidewalls of the spacer layers are substantially coplanar with sidewalls of the isolation layers.

12. The memory device according to claim 10, wherein the switching layer has a wall portion and protruded portions protruded from the wall portion and filled in spaces between the vertically separated annulus portions of the outer electrode.

13. The memory device according to claim 10, wherein the conductive pillars has thick portions and narrow portions alternately arranged along the vertical direction, and the memory device further comprises:
annulus spacers, laterally surrounding the narrow portions of the conductive pillar, and in lateral contact with the spacer layers.

14. The memory device according to claim 13, wherein the annulus spacers are formed of an insulating material.

15. A memory device, comprising:
a stacking structure, comprising film sets and spacer layers alternately stacked on a substrate, wherein each of the film sets comprises a composite layer and an isolation layer lying above or below the composite layer, and the composite layers respectively comprise a word line, a channel layer laterally adjacent to the word line, and a gate dielectric layer lining between the word line and the channel layer; and
a conductive pillar and a storage pillar, separately penetrating through the stacking structure along a vertical direction, wherein the channel layers in the stacking structure are penetrated through by the conductive pillar and the storage pillar, and the storage pillar comprises:
an inner electrode, continuously extending along the vertical direction;
a switching layer, wrapping around the inner electrode; and
an outer electrode, laterally surrounding the switching layer,
wherein the spacer layers laterally protrude into the storage pillar with respect to the isolation layers and the channel layers, and the outer electrode of the storage pillar has annulus portions vertically separated from one another by protruded portions of the spacer layers.

16. The memory device according to claim 15, wherein the spacer layers are in lateral contact with the switching layer.

17. The memory device according to claim 15, wherein the spacer layers have etching selectivity with respect to the isolation layers and the channel layers.

18. The memory device according to claim 15, wherein the conductive pillar has a substantially straight sidewall.

19. The memory device according to claim 15, wherein sidewalls of the spacer layers in lateral contact with the conductive pillar are substantially coplanar with sidewalls of the composite layers in lateral contact with the conductive pillar as well as sidewalls of the isolation layers in lateral contact with the conductive pillar.

20. The memory device according to claim 15, wherein the switching layer is formed as a wall structure having a wall thickness substantially constant along the vertical direction.

* * * * *